US009207531B2

(12) United States Patent
Nakamura et al.

(10) Patent No.: US 9,207,531 B2
(45) Date of Patent: Dec. 8, 2015

(54) PATTERN FORMING METHOD

(75) Inventors: Hiroko Nakamura, Yokohama (JP); Koji Asakawa, Kawasaki (JP); Shigeki Hattori, Yokohama (JP); Satoshi Tanaka, Kawasaki (JP); Toshiya Kotani, Machida (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 1030 days.

(21) Appl. No.: 13/239,449

(22) Filed: Sep. 22, 2011

(65) Prior Publication Data
US 2012/0127454 A1 May 24, 2012

(30) Foreign Application Priority Data

Nov. 18, 2010 (JP) ................................. 2010-258009

(51) Int. Cl.
*H01L 21/31* (2006.01)
*H01L 21/469* (2006.01)
*G03F 7/00* (2006.01)
*B81C 1/00* (2006.01)
*B82Y 10/00* (2011.01)
*B82Y 40/00* (2011.01)

(52) U.S. Cl.
CPC .......... *G03F 7/0002* (2013.01); *B81C 1/00031* (2013.01); *B82Y 10/00* (2013.01); *B82Y 40/00* (2013.01); *B81C 2201/0149* (2013.01)

(58) Field of Classification Search
None
See application file for complete search history.

(56) References Cited

U.S. PATENT DOCUMENTS

2009/0233236 A1* 9/2009 Black ........................... 430/311

FOREIGN PATENT DOCUMENTS

JP 2001-151834 6/2001

OTHER PUBLICATIONS

Phong Du, et al., "Additive-Driven Phase-Selective Chemistry in Block Copolymer Thin Films: The Convergence of Top-Down and Bottom-Up Approaches", Advanced Materials, 16, No. 12, Jun. 17, 2004, pp. 953-957 (Previously Filed, Submitting Statement of Relevancy Only).
Mingqi Li, et al., "Spatially Controlled Fabrication of Nanoporous Block Copolymers", Fabrication of Nanoporous Block Copolymers, Chem. Mater., vol. 16, No. 20. 2004, pp. 3800-3808 (Previously Filed, Submitting Statement of Relevancy Only).

(Continued)

*Primary Examiner* — Seahvosh Nikmanesh
(74) *Attorney, Agent, or Firm* — Oblon, McClelland, Maier & Neustadt, L.L.P.

(57) ABSTRACT

According to one embodiment, a pattern including first and second block phases is formed by self-assembling a block copolymer onto a film to be processed. The entire block copolymer present in a first region is removed under a first condition by carrying out energy beam irradiation and development, thereby leaving a pattern including the first and second block phases in a region other than the first region. The first block phase present in a second region is selectively removed under a second condition by carrying out energy beam irradiation and development, thereby leaving a pattern including the first and second block phases in an overlap region between a region other than the first region and a region other than the second region, and leaving a pattern of second block phase in the second region excluding the overlap region. The film is etched with the left patterns as masks.

24 Claims, 15 Drawing Sheets

(56) References Cited

OTHER PUBLICATIONS

Mingqi Li, et al., "Spatially Controlled Fabrication of Nanoporous Block Copolymers", Fabrication of Nanoporous Block Copolymers, Chem. Mater., vol. 16, No. 20, 2004, pp. 3800-3808.

Phong Du, et al., "Additive-Driven Phase-Selective Chemistry in Block Copolymer Thin Films: The Convergence of Top-Down and Bottom-Up Approaches", Advanced Materials, 16, No. 12, Jun. 17, 2004, pp. 953-957.

* cited by examiner

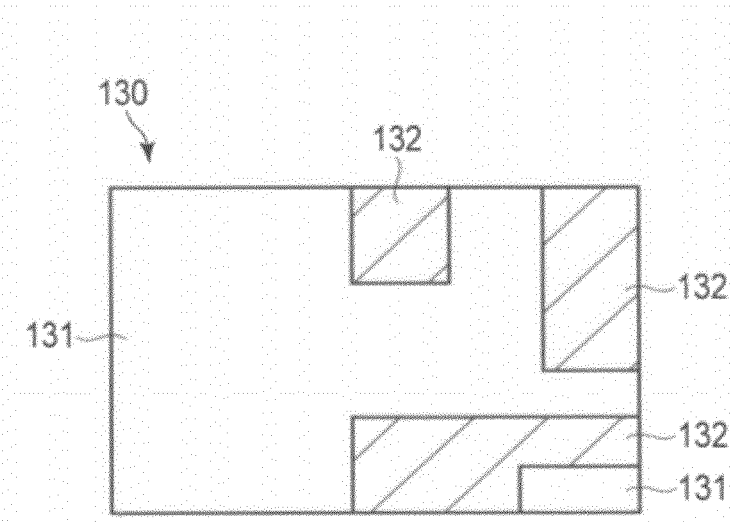
F I G. 4 A
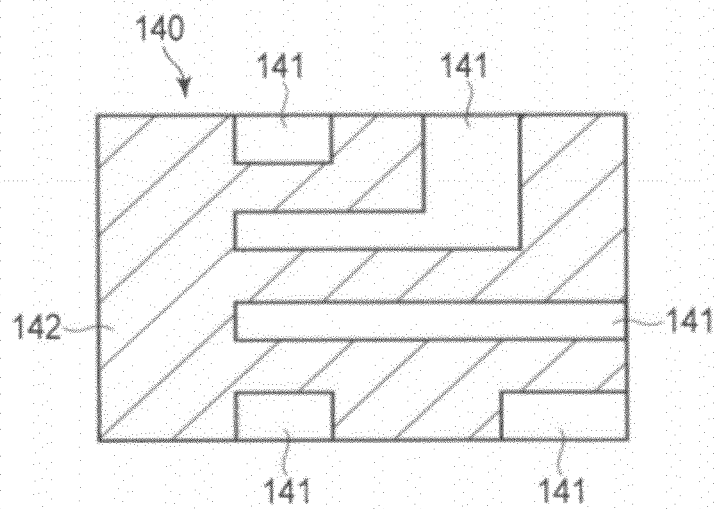
F I G. 4 B

Cell section (C) ←→ Extraction wiring (W) ←→ Peripheral circuit section (P)

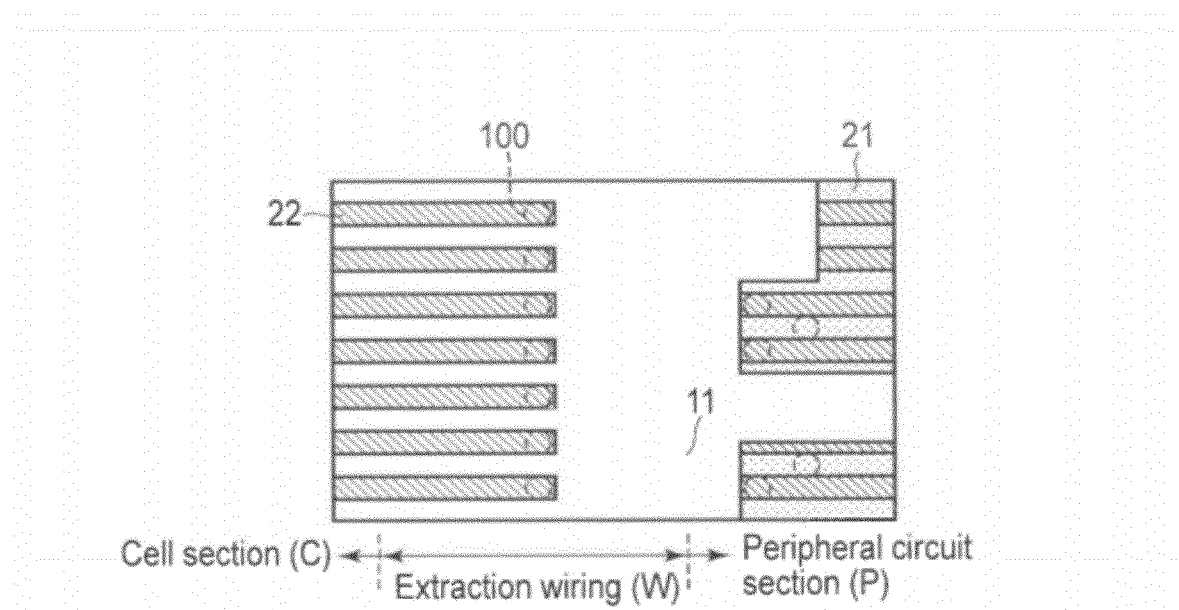
F I G. 10
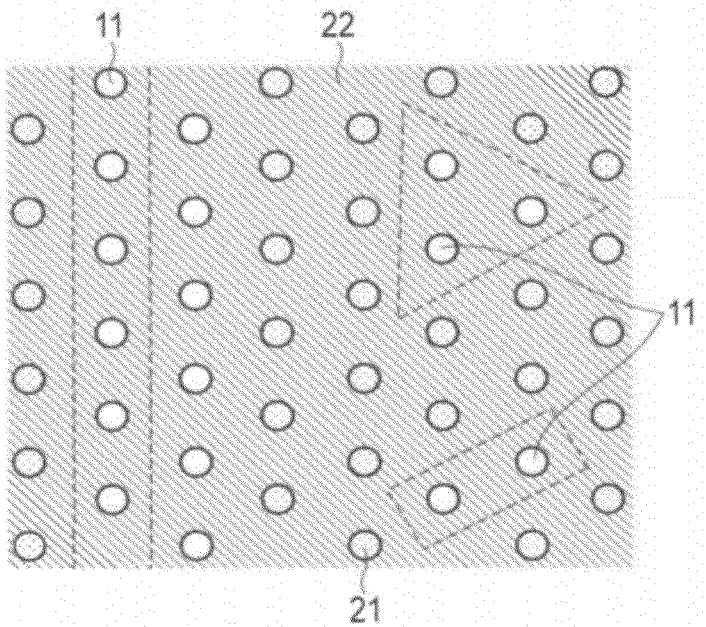
F I G. 11

US 9,207,531 B2

PATTERN FORMING METHOD

CROSS-REFERENCE TO RELATED APPLICATIONS

This application is based upon and claims the benefit of priority from prior Japanese Patent Application No. 2010-258009, filed Nov. 18, 2010, the entire contents of which are incorporated herein by reference.

FIELD

Embodiments described herein relate generally to a pattern forming method.

BACKGROUND

Semiconductor patterning has been carried out as follows. More specifically, a resist is applied onto a film to be processed, the resist is exposed to light to make the exposed region soluble or insoluble in a developer and then developed to form a resist pattern, and the film to be processed is processed with the resist pattern as a mask.

However, with miniaturization in pattern size, high costs have been problematic due to high-priced exposure apparatuses and rising running costs.

Therefore, use of a method is attempted in which a block copolymer (BCP) is heated to be microphase-separated, that is, self-assembled (DSA), the block copolymer is then subjected to trimming to define a region in which a periodic pattern is to be formed, and only either one of the blocks of the block copolymer is then removed to form the periodic pattern only in a desired region. However, in order to further form a nonperiodic pattern, a lot of additional processes will be required and the manufacturing cost will be increased.

BRIEF DESCRIPTION OF THE DRAWINGS

FIGS. 4A and 4B are plan views illustrating reticles for use in the pattern forming method according to the second embodiment;

FIG. 10 is a plan view illustrating an example of a device pattern in the fifth embodiment;

FIG. 11 is a plan view illustrating an example of a device pattern in the fifth embodiment;

DETAILED DESCRIPTION

Figure 1A:
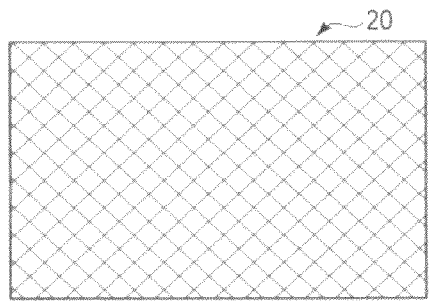
FIGS. 1A, 1B, 1C, 1D, 1E and 1F are plan views illustrating a pattern forming method according to a first embodiment.

In general, according to one embodiment, a self-assembling block copolymer is prepared which includes a first block and a second block and has a property that the entire block copolymer is removed under a first condition including energy beam irradiation or heating, and development or dry etching, whereas a self-assembled first block phase is selectively removed under a second condition including energy beam irradiation or heating, and development or dry etching. A pattern including a first block phase and a second block phase is formed by applying the block copolymer onto a film to be processed and self-assembling the block copolymer. The entire block copolymer present in a first region is removed under the first condition by carrying out energy beam irradiation or heating selectively to the block copolymer and carrying out development or dry etching. Thus, a pattern including a first block phase and a second block phase is left in a region other than the first region. A first block phase present in a second region is selectively removed under the second condition by carrying out energy beam irradiation or heating selectively to the left block copolymer and carrying out development or dry etching. Thus, a pattern including a first block phase and a second block phase is left in an overlap region between a region other than the first region and a region other than the second region, and a pattern of second block phase is left in the second region excluding the overlap region. The film to be processed is subjected to etching with the left patterns as masks.

Embodiments will be described below with reference to the drawings.

First Embodiment

A pattern forming method according to the first embodiment will be described with reference to FIGS. 1A to 1F. FIG. 1F shows an etching mask pattern corresponding to an intended pattern of processed film. The pattern of processed film includes a cell section comprising a periodical line and space (L & S) pattern, a peripheral circuit section, and an extraction wiring for connecting the cell section and the peripheral circuit section. The peripheral circuit section has a large dimension than the half pitch of the line and space (L & S) pattern in the cell section. While the line of the extraction wiring has the same width of that of the line in the cell section, the extraction wiring has a nonperiodic pattern.

In the first embodiment, exposure and development are carried out twice. The first exposure and development removes (trims) the entire block copolymer in a certain region, to leave a block copolymer including a desired periodic pattern and a desired nonperiodic pattern in the other region. The second exposure and development removes only a first block in the certain region to form a desired periodic pattern.

In the first embodiment, a block copolymer B1 is used which contains poly p-t-butoxycarbonyloxy-α-methylstyrene and poly t-butylacrylate as a first block and a second block, respectively. This block copolymer B1 is represented by the following chemical formula:

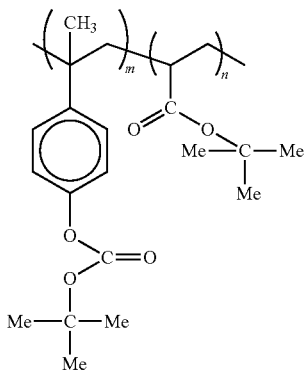

The coating liquid of the block copolymer B1 has a photoacid generator (PAG) added. The first block has a hydroxyl group of a styrene side chain, which is protected by a t-butoxycarbonyl group. The second block has a carboxyl group protected by a t-butyl group. These protective groups bonded to each other make both the first and second blocks insoluble in a developer comprising a tetramethylammonium hydroxide (TMAH) aqueous solution.

When the block copolymer B1 is exposed to ArF light, an acid is generated from the photoacid generator. Then, when heating is carried out with the use of a baker, the acid acts as a catalyst to eliminate the t-butoxycarbonyl group and the t-butyl group, and thus make the entire block copolymer B1 soluble in the TMAH solution. Therefore, in the region irradiated with the ArF light, the entire block copolymer B1 is dissolved in the TMAH solution, and thus removed.

In addition, when the block copolymer B1 is exposed to the ArF light, the first block has a main chain cleaved to turn into a low molecular weight polyhydroxystyrene. Therefore, for example, when the block copolymer B1 is developed with isopropyl alcohol, only the first block is removed.

Figure 1D:
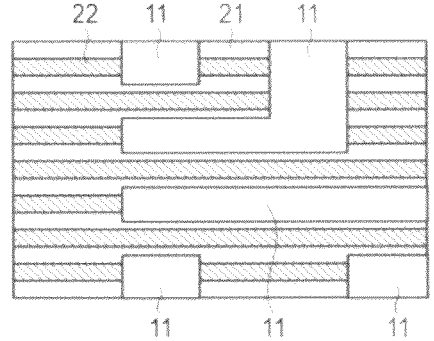

First, as shown in FIG. 1A, a block copolymer 20 is applied onto a film 11 to be processed on a wafer. The composition of the block copolymer B1 used has a ratio of approximately 7:3 between the first block and the second block. When the block copolymer B1 of this composition is subjected to annealing, a first block phase and a second block phase are each cylindrically self-assembled (microphase-separated), and arranged alternately to provide approximately 1:1 in terms of width. Although not shown, a physical guide pattern is formed in advance on the film 11 to be processed, in order to orient the two types of self-assembled block phases.

Figure 1B:
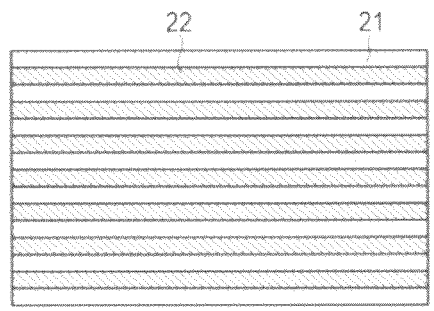
Figure 1E:
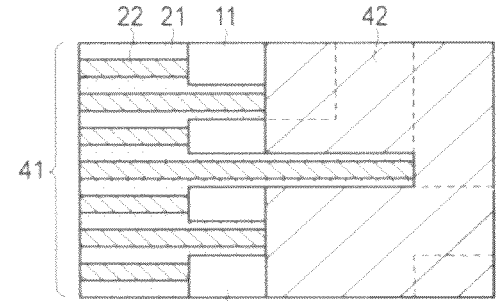

In addition, as shown in FIG. 1B, the block copolymer B1 is self-assembled by annealing under a nitrogen atmosphere with the use of an oxygen-free oven, to alternately arrange cylindrically-shaped first block phases 21 and cylindrically-shaped second block phases 22 along the side of the physical guide.

Figure 2A:
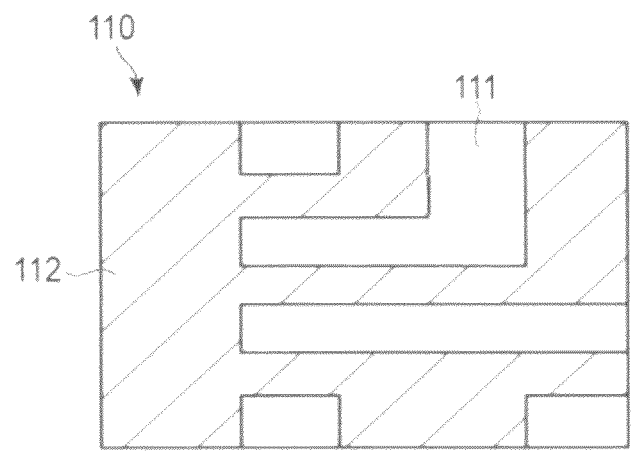
FIGS. 2A and 2B are plan views illustrating reticles for use in the pattern forming method according to the first embodiment.

Next, as shown in FIG. 2A, in order to carry out the first reduced projection exposure, a first reticle 110 is prepared which has a pattern of a light shielding film (or a halftone film) 112 formed on a quartz substrate 111. The pattern size on the first reticle 110 is four times as large as the pattern size on the wafer. The first reticle 110 is placed over the wafer with a lens interposed therebetween.

Figure 1C:
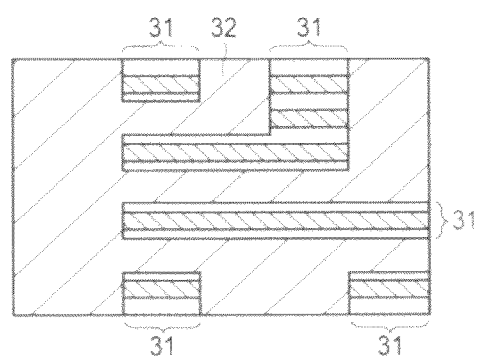
Figure 1F:
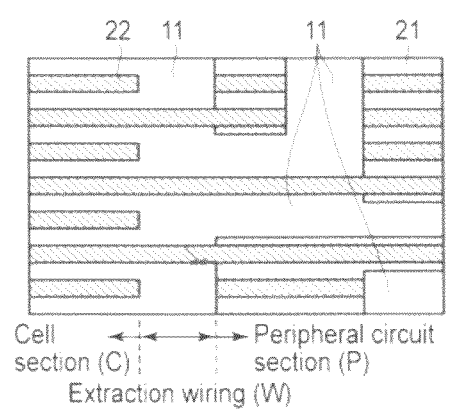

Furthermore, as shown in FIG. 1C, the self-assembled block copolymer B1 is subjected to reduced projection exposure with ArF light transmitting through the light transmitting section (the quartz substrate 111) of the first reticle 110. An exposed region 31 corresponding to the light transmitting section (the quartz substrate 111) of the first reticle 110 is referred to as a first region, whereas an unexposed region 32 corresponding to the light shielding film 112 of the first reticle 110 is referred to as a region other than the first region. The unexposed region 32 (the region other than the first region) includes a cell section and a line of a peripheral circuit section.

When development is carried out with the use of a TMAH aqueous solution after heating with the use of a baker, the entire block copolymer B1 including the first block phases 21 and the second block phases 22 is removed (trimmed) in the first region as shown in FIG. 1D. In this way, the block copolymer B1 including a desired periodic pattern and a desired nonperiodic pattern is left in the region other than the first region.

Figure 2B:
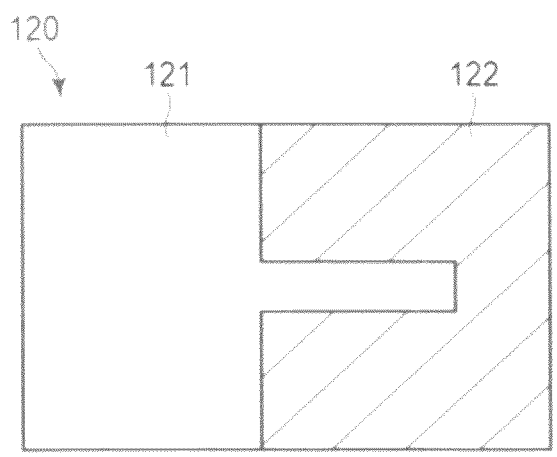

Next, as shown in FIG. 2B, in order to carry out the second reduced projection exposure, a second reticle 120 is prepared which has a pattern of a light shielding film (or a halftone film) 122 formed on a quartz substrate 121. The pattern size on the second reticle 120 is four times as large as the pattern size on the wafer. The second reticle 120 is placed over the wafer with a lens interposed therebetween.

Furthermore, as shown in FIG. 1E, the block copolymer B1 experienced the first exposure and development is subjected to reduced projection exposure with ArF light transmitting through the light transmitting section (the quartz substrate 121) of the second reticle 120. An exposed region 41 corresponding to the light transmitting section (the quartz substrate 121) of the second reticle 120 is referred to as a second region, whereas an unexposed region 42 corresponding to the light shielding film 122 of the second reticle 120 is referred to as a region other than the second region. The second region corresponds to a region in which a cell section and a pattern of an extraction wiring are to be formed. In this way, the main chains of the first block phases 21 are cleaved to be broken.

When development is carried out with the use of isopropyl alcohol, only the first block phases 21 are removed in the second region, as shown in FIG. 1F. As a result, this removal leaves a periodic line and space (L & S) pattern for the cell section and a pattern corresponding to the extraction wiring. In addition, a pattern including the first block phases 21 and the second block phases 22 is left so as to correspond to the peripheral circuit section in an overlap region between the unexposed region 32 (the region other than the first region) in the first exposure and the unexposed region 42 (the region other than the second region) in the second exposure.

Thus, a pattern of the block copolymer B1 is formed which serves as an etching mask. With the pattern of the block copolymer B1 as a mask, the film to be processed is subjected to etching. When the pattern of the block copolymer B1 is removed, a desired pattern of processed film is obtained.

As is clear from FIGS. 1C and 1D, the width of the light shielding film 112 of the first reticle 110 for forming the pattern of the extraction wiring is designed so that the unexposed region 32 in the first exposure covers the width of a second block phase 22, but does not cover the adjacent second block phase 22. More specifically, the width of the light shielding film 112 is designed so that the width of the unexposed region 32 is more than 0.5 times (half pitch) the pitch of the first and second block phases, less than 1.5 times the pitch of the first and second block phases, and typically comparable to the pitch of the first and second block phases.

In other words, the final extraction wiring can be formed with approximately half the width of a line pattern obtained by patterning in an exposure apparatus. This means that it is possible to use more inexpensive exposure apparatuses with low resolution performance and that there is also no need for additional processes such as double patterning for pattern formation, which is thus advantageous for cost reduction.

Comparative Example

Next, an example of a conventional pattern forming method will be described as a comparative example for comparison with the method according to the first embodiment. In this example, in order to form the same etching mask pattern as FIG. 1F in accordance with a conventional method, it will be assumed that a pattern transferred on a hard mask is formed to correspond to the patterns of a cell section and of an extraction wiring, and a resist pattern is formed to correspond to the pattern of a peripheral circuit section.

Figure 22A:
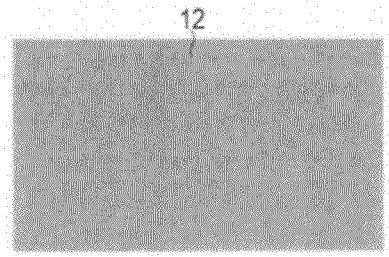
FIGS. 22A, 22B, 22C, 22D, 22E, 22F, 22G and 22H are plan views illustrating a pattern forming method according to a comparative example.
Figure 22B:
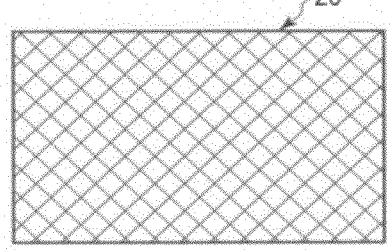
Figure 22C:
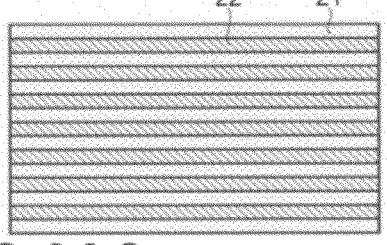

First, as shown in FIG. 22A, a hard mask 12 is formed on a film 11 to be processed on a wafer. As shown in FIG. 22B, the same block copolymer 20 as that used in the first embodiment is applied onto the hard mask 12. In the same way as in the case of the first embodiment, as shown in FIG. 22C, the block copolymer is self-assembled by annealing in an oxygen-free oven, to alternately arrange cylindrically-shaped first block phases 21 and cylindrically-shaped second block phases 22 along the side of a physical guide.

Figure 23A:
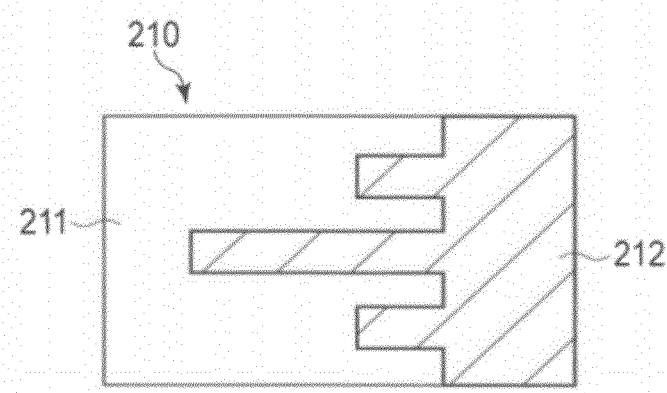
FIGS. 23A and 23B are plan views illustrating reticles for use in the pattern forming method according to the comparative example.

Next, as shown in FIG. 23A, in order to carry out the first reduced projection exposure, a first reticle 210 is prepared which has a pattern of a light shielding film (or a halftone film) 212 formed on a quartz substrate 211. The first reticle 210 for use in the comparative example has a light transmitting section comprising the quartz substrate 211 without the light shielding film 212 to serve as a region corresponding to a peripheral circuit section, and has the pattern of the light shielding film 212 to serve as a region corresponding to a cell section and an extraction wiring, and the first reticle 210 has a pattern different from the first reticle 110 for use in the first embodiment.

Figure 22D:
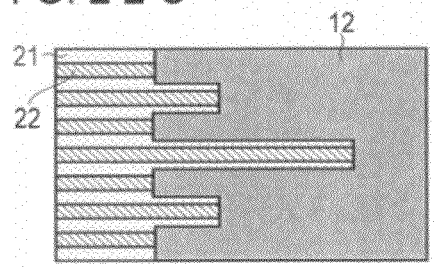

As shown in FIG. 22D, the self-assembled block copolymer B1 is subjected to reduced projection exposure with ArF light transmitting through the light transmitting section (the quartz substrate 211) of the first reticle 210. When development is carried out with the use of a TMAH aqueous solution after heating with the use of a baker, the entire block copolymer is removed in the peripheral circuit section, whereas the block copolymer is left on the cell section and the extraction wiring.

Figure 22E:
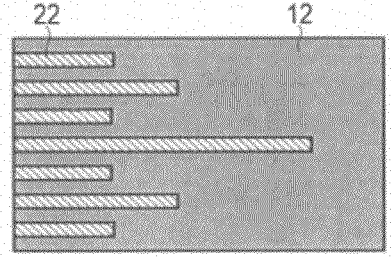

As shown in FIG. 22E, the left block copolymer is again exposed to ArF light to cleave and thus break the main chains of the first block phases 21. When development is carried out with the use of isopropyl alcohol, only the first block phases 21 are removed, whereas a pattern of the second block phases 22 is left for the cell section and the extraction wiring.

Figure 22F:
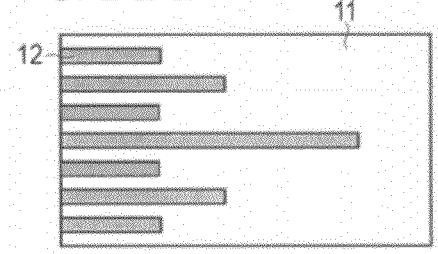

As shown in FIG. 22F, the hard mask 12 is subjected to etching with the pattern of the second block phases 22 as a mask. When the second block phases 22 are removed by asking, the pattern of the hard mask 12 is obtained.

Figure 22G:
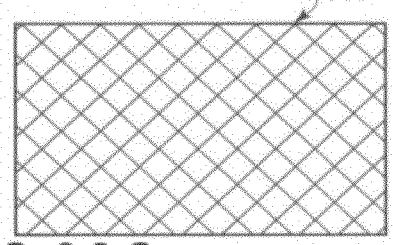

As shown in FIG. 22G, a resist 200 is applied onto the exposed film 11 to be processed and the pattern of the hard mask 12.

Figure 23B:
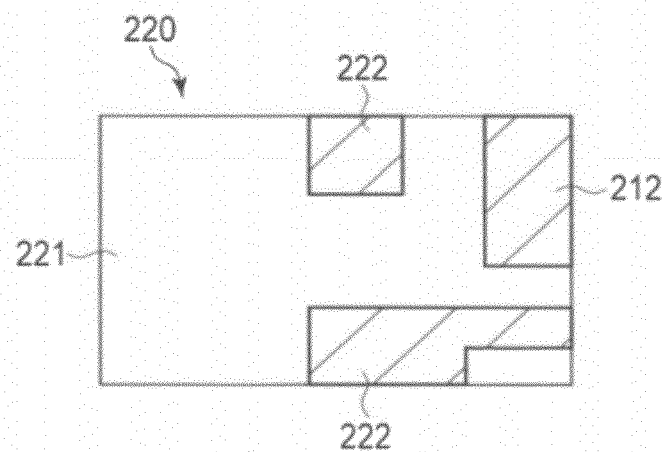

Next, as shown in FIG. 23B, in order to carry out the second reduced projection exposure, a second reticle 220 is prepared which has a pattern of a light shielding film (or a halftone film) 222 formed on a quartz substrate 221. The second reticle 220 for use in the comparative example has a light shielding section comprising the pattern of the light shielding film 222 to serve as a region corresponding to the peripheral circuit section, and has a light transmitting section comprising the quartz substrate 221 without the light shielding film 222 to serve as a region corresponding to a region other than the peripheral circuit section, and the second reticle 220 has a pattern different from the second reticle 120 for use in the first embodiment.

Figure 22H:
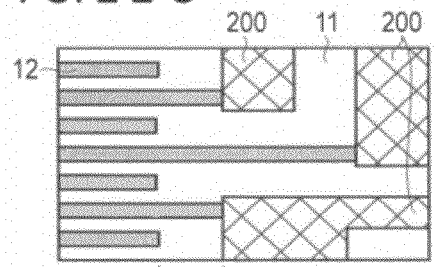

As shown in FIG. 22H, the resist 200 is subjected to reduced projection exposure with ArF light transmitting through the light transmitting section (the quartz substrate 221) of the second reticle 220. When development is carried out with the use of a developer, the resist 200 is removed in the region other than the peripheral circuit section, whereas the pattern of the resist 200 is left in the peripheral circuit section.

The film 11 to be processed is subjected to etching with the pattern of the resist 200 and the pattern of the hard mask 12 as masks. When the pattern of the resist 200 and the pattern of the hard mask 12 are removed, a desired pattern of processed film is obtained.

The method according to the first embodiment eliminates the need for the formation of the hard mask, the etching of the hard mask, the application of the resist, and the exposure and development of the resist, as compared with the method according to the comparative example. Therefore, the method according to the first embodiment can keep down costs more than the method according to the comparative example can.

Modified Examples

While ArF light is used for both times as the exposure light, the exposure light is not limited to ArF light. In addition, the first exposure wavelength may be made different from the second exposure wavelength. In this case, the use of an acid generator which generates an acid only in either one of exposure lights allows an acid to be generated selectively in either the first exposure or the second exposure.

In order to remove the entire block copolymer, what is required is only to make it possible to generate an acid from an acid generator and eliminate a protective group of the block copolymer with the acid as a catalyst, thereby making the block copolymer soluble in a developer. Therefore, it is possible to use light of other wavelength. In addition, the exposure is not limited to exposure to light, and electron beams and ion beams can also be used. Furthermore, it is not necessary to use the reticle, and scanning with laser light, electron beams, or ion beams may be carried out in accordance with data created in advance, or shape forming may be carried out with an aperture.

In addition, it is not always necessary to introduce the protective group for the purpose of changing the polarity for the both blocks of the block copolymer, the protective group may be introduced only into either one of the blocks as long as a change in the polarity of the block makes the entire block copolymer soluble in a developer. Alternatively, either one of the blocks may be made soluble in a developer with a change in polarity, whereas the main chain of the other block may be cleaved to make the block soluble in the developer.

The alkaline developer is not limited to the TMAH aqueous solution, and may be other alkaline aqueous solution. An organic solvent may be used as the developer, and in this case, the soluble part and the insoluble part are reversed from each other, as compared with the case of using an aqueous solution. The heating after the exposure eliminates a protective group of the block copolymer with the use of an acid as a catalyst in the first embodiment, however, it is not always necessary to carry out heating after exposure, when the elimination reaction of a protective group is caused at room temperature as in the case of acetal.

The polarity of the block copolymer can also be changed by adding a thermal acid generator (TAG) to a block copolymer having a side chain with a hydroxy group or a carboxyl group protected by a protective group such as a t-butoxycarbonyl group or a t-butoxy group and heating the block copolymer with the acid generator added. When the heating generates an acid from TAG to eliminate the protective group such as a t-butoxycarbonyl group or a t-butoxy group from the block copolymer with this acid serving as a catalyst, the hydroxy group or carboxyl group is generated, thereby providing a change in the polarity of the block copolymer. In this case, the block copolymer is irradiated with laser light to carry out local heating. In this way, the entire block copolymer can selectively be removed in a certain region.

In order to remove only either one of the blocks of the block copolymer, the main chain is cleaved in one of the blocks. In the case of cleaving the main chain of the block by exposure to light, exposure light is used which has a wavelength absorbed by the block and has energy required for cleaving the main chain of the block. The main chain of the block may be cleaved by heating. This type of thermally-degradable polymer is disclosed in, for example, Jpn. Pat. Appln. KOKAI Publication No. 2001-151834. The main chain of the block may be cleaved by generating an acid from a photo-acid generator through light irradiation, and then causing the acid to serve as a catalyst through heating.

The developer used for removing only either one of the blocks is not limited to isopropyl alcohol. What is required is that the main chain of the block is cleaved to make the generated low molecular polymer soluble, and other organic solvents than isopropyl alcohol can also be used.

In removing either one of the blocks, it is not always necessary to carry out development. For example, light irradiation can be carried out in vacuum to cleave and remove the main chain of either one of the blocks in the irradiated region.

In order to make a difference in reaction between the first exposure and the second exposure, the wavelength of the exposure light may be changed, and an acid generator may be used which generates an acid only with either one of the exposure lights. In this way, a difference can be made in the amount of acid generation between the first exposure and the second exposure.

The removed region may selectively be changed by using an alkaline developer as the developer in both the first development and the second development, and making a difference in the concentration of the alkaline developer between the both developments. For example, a higher concentration of alkaline developer may be used in the case of removing the entire block copolymer, whereas in the case of removing only either one of the blocks, a lower concentration of alkaline developer may be used to remove only a low molecular weight polymer which is generated by cleaving the main chain of the block through exposure to light. Alternatively, the removed region may selectively be changed by using an organic solvent as the developer in both the first development and the second development, and making a difference in the polarity of the organic solvent between the both developments.

In order to remove only either one of the blocks, dry etching may be carried out. In this case, the etching selectivity is controlled between an exposed region and an unexposed region, and also controlled between an unexposed first block and second block. For example, as the first block, a polymer is used which is cross-linked by exposure to light as in the case of a negative resist. An exposed peripheral circuit and an unexposed cell section are subjected to dry etching to etch the first block in the cell section.

Methods for changing the selectivity of dry etching include the following methods. Oxygen, fluorocarbon (for example, $CF_4$, $CHF_3$, etc.), $H_2O$, $CO_2$, Ar, etc. are used as etching gases. The use of these gases by themselves or the use of the gases as a mixed gas with a mixture ratio controlled allows a difference in etching rate to be made between the first block and the second block, and thus allows the etching selectivity to be adjusted. In addition, the change in bias voltage changes ion energy, thereby allowing the ratio between sputtering and a chemical reaction to be adjusted for the first block and the second block, and thus allowing the etching selectivity to be adjusted.

While the block copolymer material represented by the above chemical formula is used here, it is effective if either one of the polymers is adapted to contain an element, an oxide of which has a lower vapor pressure, for example, Si, whereas the other polymer comprises only an organic material, an oxide of which has a higher vapor pressure so as to make the oxide more likely to be etched by oxygen.

While the composition of the block copolymer is selected so that the block copolymer has a cylindrical structure in the first embodiment, a composition may be used to provide a lamellar block copolymer. In this case, the composition is approximately 1:1 between polymer 1 and polymer 2. In this case, in order to orient the lamellar so as to be perpendicular to the surface rather than parallel to the surface, it is necessary to form an intermediate film for adjusting energy between the film to be processed and the surface of the block copolymer.

In the first embodiment, the physical guide is used as a guide for orienting the block copolymer to achieve so-called graphoepitaxy. However, the method for orienting the block copolymer is not limited to this method described above. For example, patterns which differ in surface energy may be formed to orient a block copolymer in accordance with the patterns. Alternatively, an electric field may be applied to orient the block copolymer. These methods are disclosed in D. Sundrani et al. Langmuir, 20, 5091 (2004); J. Y. Cheng et al., Adv. Mater., 20, 3155 (2008); T. L. Morkved, Science, 273, 931 (1996), etc. These methods can form a pattern which is smaller in size than a pattern obtained by patterning in an exposure apparatus.

As described above, in the first embodiment, the periodic pattern and the nonperiodic pattern are formed by removing the entire block copolymer to leave a region including a desired periodic pattern and a desired nonperiodic pattern, and removing only either one of the blocks of the block copolymer to form a periodic pattern only in a desired region. Besides the modifications described above, various modifications can be made to the material of the block copolymer material, the guide for orienting the block copolymer, the lithography conditions, and the dry etching conditions, which can achieve this method.

Second Embodiment

A pattern forming method according to the second embodiment will be described with reference to FIGS. 3A to 3D. FIG. 3D shows an etching mask pattern corresponding to an intended pattern of processed film. The pattern in FIG. 3D is the same as the pattern in FIG. 1F.

In the second embodiment, exposure and development are carried out twice. The first exposure and development remove only a first block in a region other than a peripheral circuit section. The second exposure and development remove an unnecessary part of a second block left in a certain region.

In the second embodiment, a block copolymer B2 is used which contains poly α-methylstyrene and polyadamantylmethylethylacrylate as a first block and the second block, respectively. This block copolymer B2 is represented by the following chemical formula:

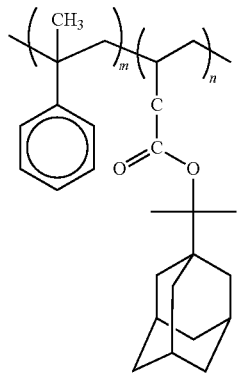

The coating liquid of the block copolymer B2 has a photoacid generator (PAG) added. When the block copolymer B2 is exposed to ArF light, the main chain of the poly α-methylstyrene as the first block is cleaved to provide a low molecular weight. For this reason, for example, when development is carried out with the use of isopropyl alcohol, only the first block is removed. The second block has a carboxyl group protected by an adamantylmethylethyl group. These protective groups bonded to each other make the second block insoluble in a developer comprising a tetramethylammonium hydroxide (TMAH) aqueous solution. When the block copolymer B2 is exposed to ArF light, an acid is generated from photoacid generator. Then, when heating is carried out with the use of a baker, the acid acts as a catalyst to eliminate the adamantylmethylethyl group, and turn the second block into a polyacrylic acid, thereby making the second block soluble in a TMAH aqueous solution. Therefore, the second block is dissolved in the TMAH aqueous solution, and thus removed in the region irradiated with ArF light.

It should be noted that the material design is made so that the first exposure amount fails to cause a sufficient deprotection reaction in the second block to leave a certain percentage of adamantylmethylethyl group, and the second exposure causes a sufficient deprotection reaction in the second block to make the second block soluble in the TMAH developer.

First, a physical guide, not shown, is formed on a film 11 to be processed, and a block copolymer 20 is applied onto the film 11 to be processed. Next, the block copolymer B2 is self-assembled by annealing under a nitrogen atmosphere with the use of an oxygen-free oven, to alternately arrange cylindrically-shaped first block phases 21 and cylindrically-shaped second block phases 22 along the side of the physical guide. The process is so far the same as in FIGS. 1A and 1B.

Next, as shown in FIG. 4A, in order to carry out first reduced projection exposure, a third reticle 130 is prepared which has a pattern of a light shielding film (or a halftone film) 132 formed on a quartz substrate 131. The pattern size on the third reticle 130 is four times as large as the pattern size on the wafer. The third reticle 130 is placed over the wafer with a lens interposed therebetween.

Figure 3A:
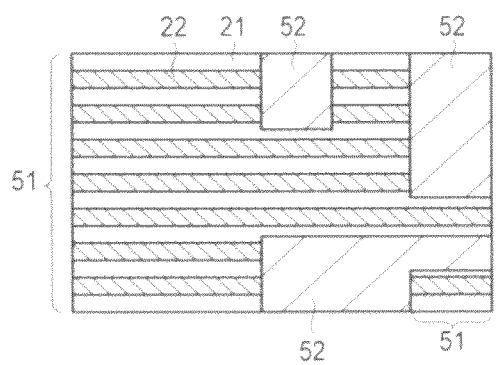
FIGS. 3A, 3B, 3C and 3D are plan views illustrating a pattern forming method according to a second embodiment.
Figure 3C:
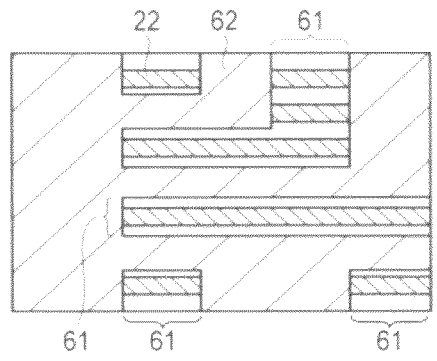

Furthermore, as shown in FIG. 3A, the self-assembled block copolymer B2 is subjected to reduced projection exposure with ArF light transmitting through the light transmitting section (the quartz substrate 131) of the third reticle 130. An exposed region 51 corresponding to the light transmitting section (the quartz substrate 131) of the third reticle 130 is referred to as a third region, whereas an unexposed region 52 corresponding to the light shielding film 132 of the third reticle 130 is referred to as a region other than the third region. The third region corresponds to a region other than a line pattern in the peripheral circuit section. In this way, the main chains of the first block phases 21 are cleaved to be broken.

Figure 3B:
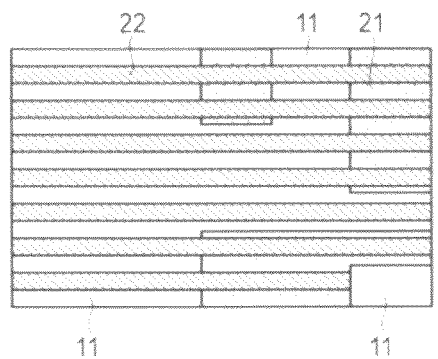
Figure 3D:
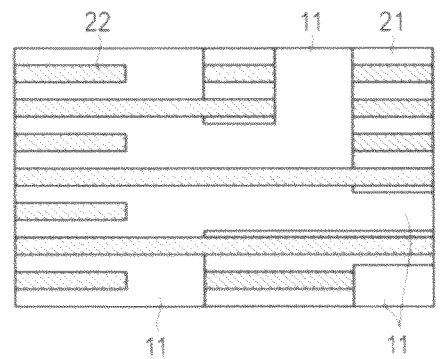

When development is carried out with the use of isopropyl alcohol, only the first block phase 21 is removed in the third region, as shown in FIG. 3B. As a result, this removal leaves a periodic line and space (L & S) pattern for a cell section and a pattern corresponding to an extraction wiring. In addition, in the unexposed region 52 (the region other than the third region), a pattern including the first block phases 21 and the second block phases 22 is left to correspond to the peripheral circuit section.

Next, as shown in FIG. 4B, in order to carry out second reduced projection exposure, a fourth reticle 140 is prepared which has a pattern of a light shielding film (or a halftone film) 142 formed on a quartz substrate 141. The pattern size on the fourth reticle 140 is four times as large as the pattern size on the wafer. The fourth reticle 140 is placed over the wafer with a lens interposed therebetween.

Furthermore, as shown in FIG. 3C, the block copolymer B2 experienced the first exposure and development is subjected to reduced projection exposure with ArF light transmitting through the light transmitting section (the quartz substrate 141) of the fourth reticle 140. An exposed region 61 corresponding to the light transmitting section (the quartz substrate 141) of the fourth reticle 140 is referred to as a fourth region, whereas an unexposed region 62 corresponding to the light shielding film 142 of the fourth reticle 140 is referred to as a region other than the fourth region. The fourth region corresponds to a region from which a pattern of an extraction wiring is to be removed.

When development is carried out with the use of a TMAH aqueous solution after heating with the use of a baker, the second block phases 22 are removed in the fourth region as shown in FIG. 3D. Thus, a periodic pattern for the cell section and the nonperiodic pattern for the peripheral circuit section are left in the region 62 other than the fourth region, and the cell section and the peripheral circuit section are connected by the pattern of the extraction wiring. With the pattern of the block copolymer B2 as a mask, the film to be processed is subjected to etching. When the pattern of the block copolymer B2 is removed, a desired pattern of processed film is obtained.

As is clear from FIGS. 3C and 3D, the width of the light shielding film 142 of the fourth reticle 140 for forming the pattern of the extraction wiring is designed so that the unexposed region 62 in the second exposure covers the width of a second block phase 22, but does not cover the adjacent second block phase 22. More specifically, the width of the light shielding film 142 in this region is set so that the width of the unexposed region 62 is more than 0.5 times (half pitch) the pitch of the first and second block phases, less than 1.5 times the pitch of the first and second block phases, and typically comparable to the pitch of the first and second block phases. In other words, the final extraction wiring can be formed with approximately half the width of a line pattern obtained by patterning in an exposure apparatus. This means that it is possible to use more inexpensive exposure apparatuses with low resolution performance and that there is also no need for additional processes such as double patterning for pattern formation, which is thus advantageous for cost reduction.

As in the case of the first embodiment, various modified examples can also be applied in the second embodiment.

Third Embodiment

Figure 5:
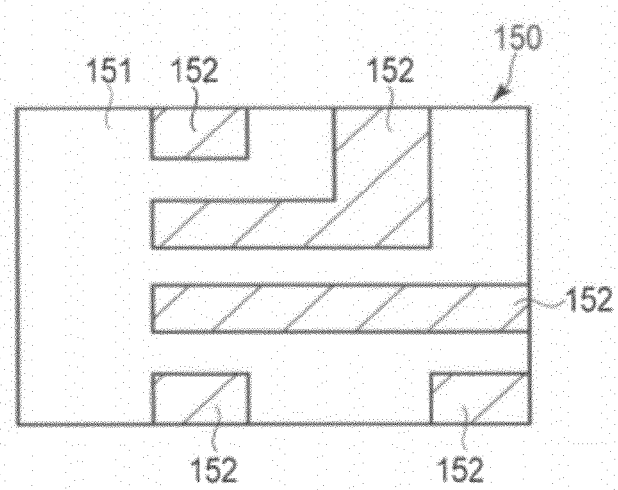
FIG. 5 is a plan view illustrating a pattern forming method according to a third embodiment.

While the same method as in the first embodiment is used in the third embodiment, a block copolymer B1 is left in an exposed region by using a fifth reticle 150 shown in FIG. 5 to carry out exposure and using an organic developer (for example, anisole) to carry out development in first exposure and development corresponding to FIG. 1C. The fifth reticle 150 has a pattern of a light shielding film 152 formed on a quartz substrate 151, and the pattern is reversed from the reticle 110 in FIG. 2A. Therefore, an unexposed region corresponding to a light shielding section comprising the pattern of the light shielding film 152 serves as a first region, whereas an exposed region corresponding to a light transmitting section comprising the quartz substrate 151 without the pattern of the light shielding film 152 serves as a region other than the first region. As described above, the block copolymer B1 is used as a negative resist in the third embodiment.

First, as in FIGS. 1A and 1B, a physical guide, not shown, is formed on a film 11 to be processed, and a block copolymer 20 is applied onto the film 11 to be processed. Next, the block copolymer B1 is self-assembled by annealing under a nitrogen atmosphere with the use of an oxygen-free oven, to alternately arrange cylindrically-shaped first block phases 21 and cylindrically-shaped second block phases 22 along the side of the physical guide.

The self-assembled block copolymer B1 is subjected to reduced projection exposure with ArF light transmitting through the light transmitting section (the quartz substrate 151) of the fifth reticle 150.

Then, the block copolymer B1 is heated with the use of a baker. As a result, the block copolymer B1 in the exposed region (the region other than the first region) has a protective group eliminated to be polar and thus insoluble in the organic developer, whereas the block copolymer B1 in the unexposed region (first region) remains soluble in the organic developer. When development is carried out with the use of anisole, the entire block copolymer B1 including the first block phases 21 and the second block phases 22 is removed (trimmed) in the unexposed region (first region) as shown in FIG. 1D. In this way, the block copolymer B1 including a desired periodic pattern and a desired nonperiodic pattern is left in the region other than the first region.

Then, as in FIG. 1E, the block copolymer B1 experienced the first exposure and development is subjected to reduced projection exposure with ArF light transmitting through the light transmitting section (the quartz substrate 121) of the second reticle 120. In this way, the main chains of the first block phases 21 are cleaved to be broken in a second region.

When development is carried out with the use of isopropyl alcohol, a periodic line and space (L & S) pattern for a cell section, a pattern corresponding to an extraction wiring, and a pattern corresponding to a peripheral circuit section are left as in FIG. 1F. It should be noted that instead of the development with the use of isopropyl alcohol, the decomposition product in the first block phase may also be vaporized by energy beam irradiation in vacuum.

Thus, a pattern of the block copolymer B1 is formed which serves as an etching mask. With the pattern of the block copolymer B1 as a mask, the film to be processed is subjected to etching. When the pattern of the block copolymer B1 is removed, a desired pattern of processed film is obtained.

The materials, lithography conditions, and irradiation energy beam used in the third embodiment are not particularly limited. What is required is to use a combination of a block copolymer with a developer in such a way that the entire block copolymer acts as a negative resist in the first exposure, and the main chain of the first block is respectively cleaved and removed in the second exposure and development.

In addition, both the first block and the second block may be made cross-linked in the first exposure, and in the second exposure, the main chain of the first polymer may be cleaved by energy beam irradiation which is absorbed only by the first block and has higher energy than the light for the first exposure.

As in the case of the first embodiment, various modified examples can also be applied in the third embodiment.

Fourth Embodiment

While the same method as in the second embodiment is used in the fourth embodiment, in second exposure and development corresponding to FIG. 3C, the fifth reticle 150 shown in FIG. 5 is used to carry out exposure, and an organic developer (for example, anisole) is used to carry out development.

First, as in FIG. 3A, the self-assembled block copolymer B2 is subjected to reduced projection exposure with ArF light transmitting through a light transmitting section (a quartz substrate 131) of a third reticle 130. When development is carried out with the use of isopropyl alcohol, a periodic line and space pattern for a cell section, a pattern corresponding to an extraction wiring, and a pattern corresponding to a peripheral circuit section are left as shown in FIG. 3B.

Next, the block copolymer B2 experienced the first exposure and development is subjected to reduced projection exposure with ArF light transmitting through the light transmitting section (the quartz substrate 151) of the fifth reticle 150 shown in FIG. 5. When the block copolymer B2 is heated with the use of a baker, the second block in the exposed region has a protective group eliminated to be polar and thus insoluble in the organic developer, whereas the second block in the unexposed region remains soluble in the organic developer. When development is carried out with the use of anisole, a periodic pattern for the cell section and a nonperiodic pattern for the peripheral circuit section are left, and the cell section and the peripheral circuit section are connected by the pattern of the extraction wiring, as in FIG. 3D. With this pattern of the block copolymer B2 as a mask, the film to be processed is subjected to etching. When the pattern of the block copolymer B2 is removed, a desired pattern of processed film is obtained.

While the materials used in the fourth embodiment are also not particularly limited, for example, a photoacid generator which generates no acid in the first exposure but generates an acid in the second exposure is used as a photoacid generator added to the block copolymer B2. In this case, the second exposure generates an acid to change the second block into a polyacrylic acid, thereby making the second block insoluble in the organic developer. In addition, a material may be used which is made cross-linked by an acid generated in the second exposure.

As in the case of the first embodiment, various modified examples can also be applied in the fourth embodiment.

Fifth Embodiment

In the fifth embodiment, modified examples will be described for device patterns formed by the pattern forming methods described in the first to fourth embodiments.

In the first to fourth embodiments, the etching mask serves as a line pattern. On the other hand, in the case of forming a trench (groove) in the film to be processed, sputtering a barrier metal and seed Cu in the trench, and then embedding a Cu wiring by plating, the space between etching masks corresponds to a line pattern.

Figure 6:
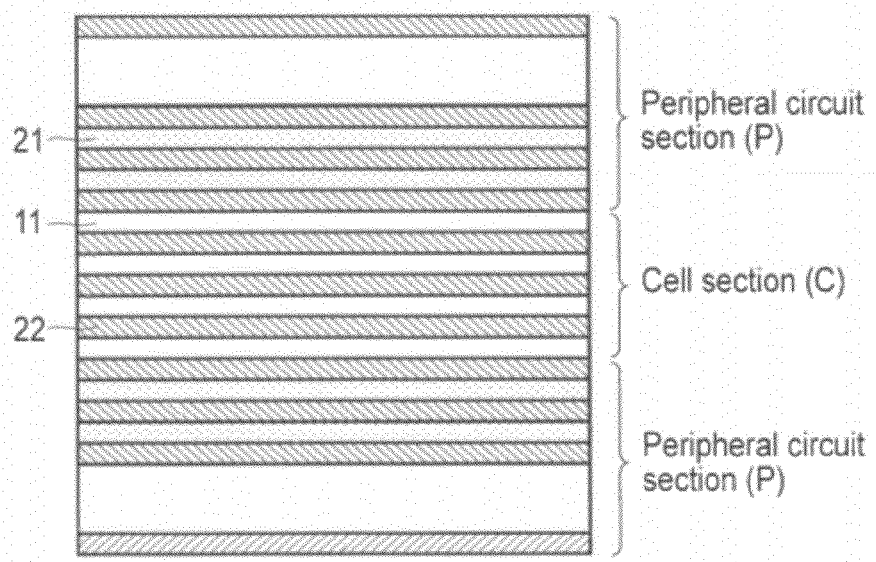
FIG. 6 is a plan view illustrating an example of a device pattern in a fifth embodiment.

FIG. 6 shows an example of a device pattern formed by the method. In a cell section, a trench pattern with a Cu wiring embedded therein is a periodic pattern. A peripheral circuit section has a nonperiodic pattern, and has a line width and space width twice or more as large as the period of the cell section. The periodic pattern in the cell section is formed by removing only the first block. The pattern in the peripheral circuit section is formed by removing the entire block copolymer.

In addition, even when the etching mask serves as a line pattern, the connection between the cell section and the peripheral circuit section is not limited to the example shown in FIG. 1F.

Figure 7:
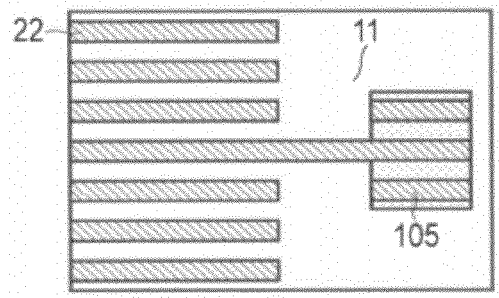
FIG. 7 is a plan view illustrating an example of a device pattern in the fifth embodiment.

FIG. 7 shows an example of a device pattern in which an extraction wiring from a cell section is connected to a pad 105. In this case, the pad corresponds to a peripheral circuit section.

Figure 8:
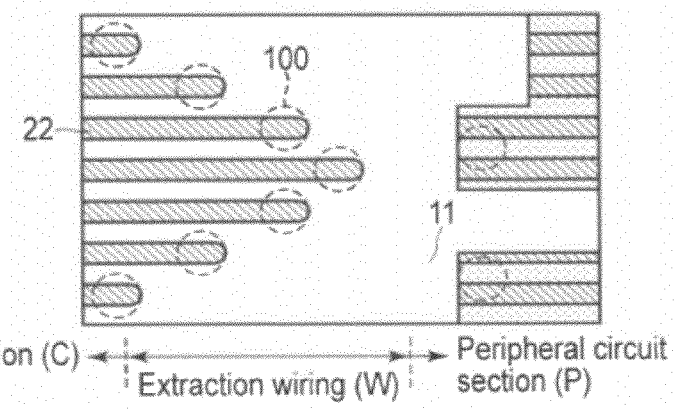
FIG. 8 is a plan view illustrating an example of a device pattern in the fifth embodiment.

FIG. 8 shows an example of a device pattern in which a cell section and a peripheral circuit section are connected to wirings at different levels through contact holes (C/H). The cell section and the peripheral circuit may be connected to wirings at different levels. The cell section and peripheral circuit section shown in FIG. 8 are transferred onto a film to be processed, an insulating layer, not shown, is deposited thereon, and the contact holes indicated by dashed lines are created for connection to upper wirings.

The diameters of contact holes formed by lithography are often larger than the half pitch in the cell section. In this case, a plurality of extraction wirings has oblique ends arranged in order not to overlap contact holes on the respective extraction wirings with each other. This line pattern is formed by obliquely trimming the entire block copolymer, and then removing only the first block in the cell section and the extraction wiring. After this, the film to be processed is processed on the basis of the pattern to form a line comprising a metal, an insulating film is deposited to create the contact holes, and the wirings on the insulating film are formed to connect the cell section and the peripheral circuit section to each other through the contact holes.

A method for forming contact holes with the use of self-assembly of a block copolymer will be described with reference to FIG. 9. A line comprising a metal is formed on the basis of a pattern as in FIG. 8, an insulating film is deposited, and a block copolymer is then applied. This block copolymer is formed under such a condition that cylindrically-shaped first block phases 21 are oriented perpendicular to the film surface when the block copolymer is self-assembled.

The block copolymer is self-assembled by annealing under a nitrogen atmosphere. Then, the cylindrically-shaped first block phases 21 are oriented perpendicular to the film surface, in such a way that the circular end faces of the cylinders are arranged to form a two-dimensional hexagonal lattice at the surface of the block copolymer layer. When the region surrounded by dashed lines in FIG. 9 are selectively exposed to light, heated, and then developed with the use of isopropyl alcohol, only the first block phases 21 are removed to form openings. The underlying insulating film can be subjected to etching through the openings to form contact holes.

Figure 9:
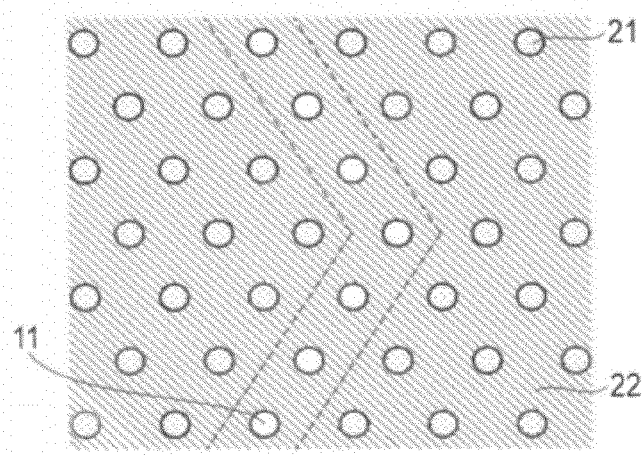
FIG. 9 is a plan view illustrating an example of a device pattern in the fifth embodiment.

It should be noted that the region in which no contact hole is to be formed, other than the region surrounded by the dashed lines in FIG. 9, may be exposed to light and heated, and developed after the first block is cross-linked in the region, thereby removing only the first block phases 21 in the region surrounded by the dashed lines.

As shown in FIG. 9, the cylinders comprising the first block is the most stable when the circular end faces are arranged to form a two-dimensional hexagonal lattice at the surface of the block copolymer layer. In this case, the metal layer is processed so that the line connecting the ends of the lines comprising the metal as shown in FIG. 8 makes an angle of ±60° to the direction of the lines.

In the case of forming contact holes with the use of self-assembly of a block copolymer, the contact-hole diameters are not always larger than the line width. In this case, it is not necessary to form each extraction wiring to have oblique ends as shown in FIG. 8.

FIG. 10 shows an example of a pattern in which respective extraction wirings have ends formed to be vertically aligned, with contact holes formed to correspond to the ends of the respective extraction wirings. In addition, FIG. 10 has a plurality of contact holes provided in a peripheral circuit section. The plurality of contact holes are provided to lower the resistance on the grounds because the peripheral circuit section has a high current value.

A method for forming the contact holes shown in FIG. 10 with the use of self-assembly of a block copolymer will be described with reference to FIG. 11. A line comprising a metal is formed on the basis of the pattern as shown in FIG. 10, an insulating film is deposited, and a block copolymer is then applied. The block copolymer is self-assembled by annealing under a nitrogen atmosphere. Cylindrically-shaped first block phases 21 are oriented perpendicular to the film surface, in such a way that the circular end faces of the cylinders are arranged to form a two-dimensional hexagonal lattice at the surface of the block copolymer layer. When the regions surrounded by dashed lines in FIG. 11 are selectively exposed to light, heated, and then developed with the use of isopropyl alcohol, only the first block phases 21 are removed to form openings. The underlying insulating film can be subjected to etching through the openings to form contact holes. In the case of FIG. 11, in order to correspond to the peripheral circuit section, triangle and rectangular regions including a plurality of cylinders are exposed to light, and developed to remove the cylinders and thus form openings. The underlying insulating film is subjected to etching through the openings to form triple holes and twin holes.

Now, the differences in conditions will be described between a case of orienting cylinders parallel to the film surface and a case of orienting perpendicular to the film surface.

When cylinders are oriented parallel to the film surface, the cylinders can be used as an etching mask for forming a line and space (L & S) pattern. On the other hand, when cylinders are oriented perpendicular to the film surface, the cylinders can be used as an etching mask for forming a contact hole pattern (the polymer removed corresponds to the cylinders; the volume fraction of the polymer removed is approximately 30%) or a dot pattern (the polymer removed corresponds to the matrix other than the cylinders; the volume fraction of the polymer removed is approximately 70%).

Whether the orientation of the cylinders is parallel or perpendicular to the film surface depends on the surface energy of a guide in the case of orienting the cylinders with the use of a physical guide or a chemical guide, and depends on the direction of an electric field or a temperature gradient, the film thickness of the block copolymer, and annealing conditions, etc. in the case of orienting the cylinders with the use of an electric field or a temperature gradient.

When the surface energy of the guide is brought close to the surface energy of the matrix of the block copolymer, a polymer layer of the matrix is formed on the surface, with the result that the cylinders are oriented parallel to the film surface. In the case of a physical guide (graphoepitaxy), the surface energy of the sidewall and bottom of the guide pattern is bought close to the surface energy of the matrix. In the case of a chemical guide, a difference is made in surface energy between a region for pinning either one of polymers and the other region. Specifically, an adjustment is made in such a way that the surface energy of a region for pinning cylinders is brought close to the surface energy of the cylinders, whereas the surface energy of the other region is brought to close to the surface energy of the matrix. In this case, the period of the chemical guide pattern is made the integral multiple of the period of the block copolymer.

When the surface energy of the guide is adjusted to have an intermediate value of surface energy between the two blocks, the cylinders are oriented perpendicular to the film surface. In the case of a physical guide (graphoepitaxy), the surface energy of the bottom of the guide pattern is adjusted to have an intermediate value of surface energy between the two blocks. When the surface energy of the sidewall of the guide pattern is adjusted to the surface energy of the matrix, a matrix layer formed is oriented on the sidewall. When the energy of the sidewall is adjusted to have an intermediate value between the two blocks, the cylinders are oriented while keeping the periodicity at the bottom in the entire region of the guide pattern. In the case of a chemical guide, a difference is made in surface energy between the region for pinning either one of polymers and the other region, in such a way that the surface energy of the region other than the pinning region is adjusted to have an intermediate value of surface energy between the two blocks, whereas the surface energy of the pinning region is adjusted to be brought close to the surface energy of either one of blocks.

In the case of orienting with the use of an electric field, an electric filed is applied in a predetermined direction in each case of orienting the cylinders parallel to and perpendicular to the surface film, because the cylinders are oriented parallel to the direction of applying an electric field.

The film thickness of the block copolymer is also an important factor to the orientation of the cylinders. In the case of orienting the cylinders parallel to the film surface, the film thickness of the block copolymer is preferably made about half the period after the self-assembly. On the other hand, in the case of orienting the cylinders perpendicular to the film surface, the film thickness of the block copolymer is preferably made approximately 1.7 times as long as the period after the self-assembly.

In orienting the block copolymer, the orientation varies depending on the direction of polarization when annealing is carried out while carrying out polarized light irradiation. In addition, the orientation also varies depending on the annealing atmosphere and the annealing time.

Next, modified examples will be described in which a periodic pattern is partially removed in order to form a contact hole or a gate.

Figure 12:
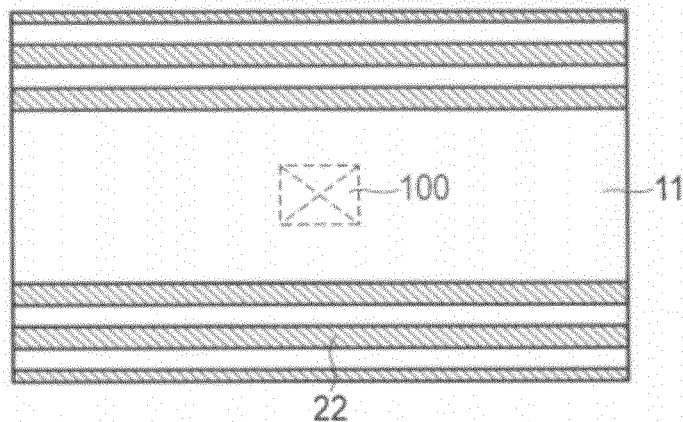
FIG. 12 is a plan view illustrating an example of a device pattern in the fifth embodiment.

FIG. 12 shows an example of a pattern including a contact hole 100 for connecting upper and lower wiring layers between two line patterns. In this case, the entire block copolymer is first removed in a region through which the contact hole 100 is to be made to pass, and only the first block 21 is then removed to form the line patterns.

Figure 13:
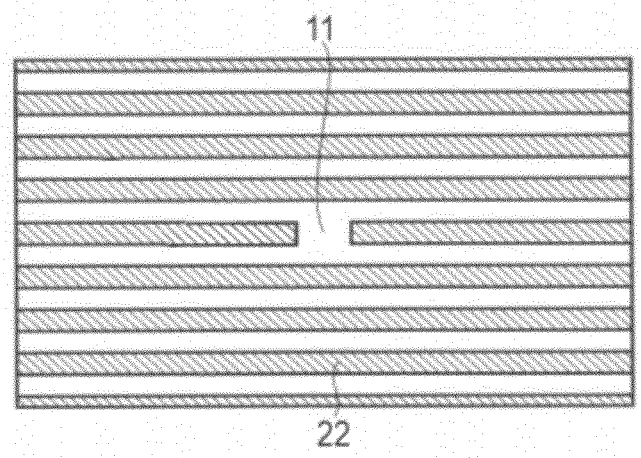
FIG. 13 is a plan view illustrating an example of a device pattern in the fifth embodiment.

FIG. 13 shows an example of a pattern including a space in the middle of a line pattern. A gate can be formed in the space. The pattern in FIG. 13 can also be formed by a similar method to that in the case of the pattern in FIG. 12. However, when the space in FIG. 13 is made through patterning by lithography, the space width depends on the performance of the exposure apparatus. In addition, when the pattern size is reduced to be brought to close to the resolution limit of the exposure apparatus, there is a possibility that line ends will cause rounding due to diffraction of light to make the space width broader than the mask size.

As a method for solving this problem, a method for forming a narrow space in the middle of a line pattern with the use of self-assembly of a block copolymer will be described with reference to FIGS. 14A to 14D.

Figure 14A:
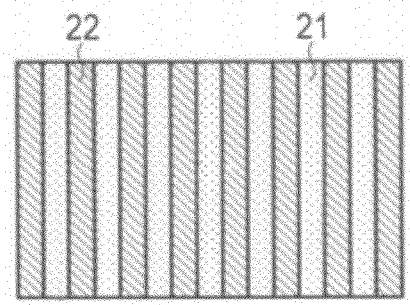
FIGS. 14A, 14B, 14C and 14D are plan views illustrating a method for forming a narrow space in the middle of a line pattern in the fifth embodiment.
Figure 14B:
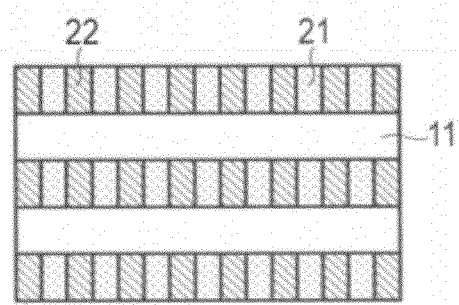
Figure 14C:
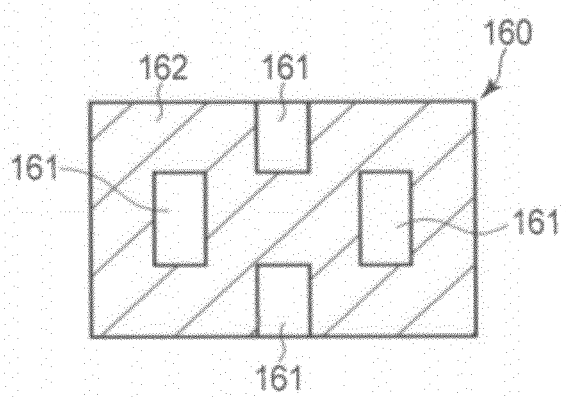
Figure 14D:
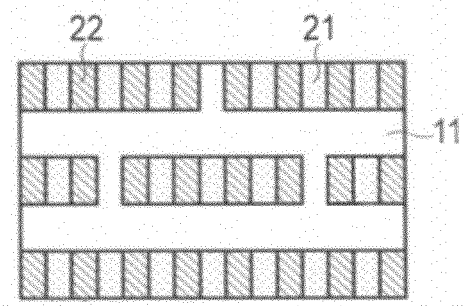

As shown in FIG. 14A, a block copolymer 20 is applied onto a film 11 to be processed, and the block copolymer is self-assembled by annealing under a nitrogen atmosphere to alternately arrange cylindrically-shaped first block phases 21 and cylindrically-shaped second block phases 22. As shown in FIG. 14B, in regions orthogonal to the cylinder length direction, the first block phases 21 and the second block phases 22 are exposed to light, and developed to remove the entire block copolymer, thereby forming a line and space (L & S) pattern. As shown in FIG. 14C, the space section is exposed to light through a light transmitting section with the use of reticle 160 with a pattern of a light shielding film (or a halftone film) 162 formed on a quartz substrate 161. When development is carried out with the use of isopropyl alcohol to remove only the first block phases 21 in the space section, a space is formed in the middle of a line pattern as shown in FIG. 14D.

In accordance with this method, the space in the middle of the line pattern is formed by removing either one of the block phases of the block copolymer, there is thus no possibility of causing rounding of the line patterns or broadening of the space width as in the case of using an exposure apparatus, and narrow spaces can be formed.

A method for further narrowing a line width and a space width in the middle of a line pattern with the use of self-assembly of a block copolymer will be described with reference to FIGS. 15A to 15G. This method includes transfer of a pattern onto a hard mask.

Figure 15A:
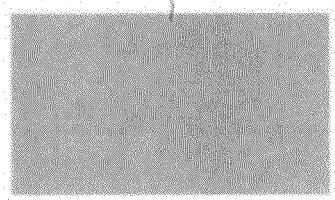
FIGS. 15A, 15B, 15C, 15D, 15E, 15F and 15G are plan views illustrating a method for forming a line pattern so as to have a narrow line width and have a narrow space width in the middle of the line pattern in the fifth embodiment.

As shown in FIG. 15A, a hard mask 12 is formed on a film 11 to be processed. As shown in FIG. 15B, a block copolymer 20 is applied onto the hard mask 12, and the block copolymer is self-assembled by annealing under a nitrogen atmosphere to alternately arrange cylindrically-shaped first block phases 21 and cylindrically-shaped second block phases 22. As shown in FIG. 15C, when a region including the pattern of the first block phases 21 is exposed to light, and developed with the use of isopropyl alcohol to remove only the first block phases 21, the hard mask 12 is exposed between the second block phases 22. As shown in FIG. 15D, the exposed hard mask 12 is subjected to etching with the second block phases 22 as a mask, and the second block phases 22 are then removed to form a pattern including the film 11 to be processed and the hard mask 12 arranged alternately.

Figure 15E:
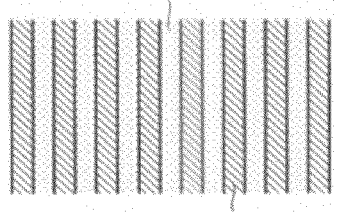
Figure 15B:
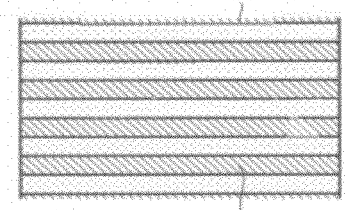
Figure 15F:
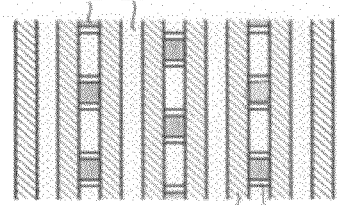
Figure 15C:
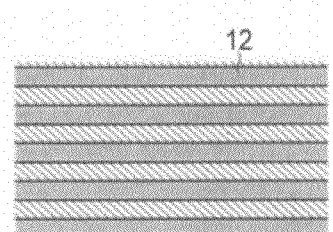
Figure 15G:
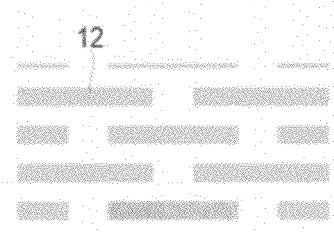
Figure 15D:
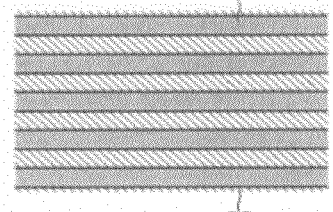

Next, as shown in FIG. 15E, a block copolymer 20 is again applied onto the film 11 to be processed and the hard mask 12, and the block copolymer is self-assembled by annealing under a nitrogen atmosphere to alternately arrange cylindrically-shaped first block phases 21 and cylindrically-shaped second block phases 22. In this case, the direction of arranging the first block phases 21 and the cylindrically-shaped second block phases 22 is set to a direction orthogonal to the direction of arranging in FIG. 15B. This setting can be achieved by making the direction of the physical guide in FIG. 15B orthogonal to that in FIG. 15E. Then, in the same way as used in FIG. 14C, a reticle including a light transmitting section corresponding to an exposed region which is broader than the width of a first block phase 21 and is not overlapped with the adjacent first block phase 21 in a space section is used to expose the space section to light through the light transmitting section. When development is carried out with the use of isopropyl alcohol to remove only the first block phases 21 in the space section, openings are formed in the middle of a line pattern to partially expose the hard mask 12 as shown in FIG. 15F. The hard mask 12 is subjected to etching with the left first block phases 21 and second block phases 22 as a mask. When the pattern of the left block copolymer is peeled, a pattern of the hard mask 12 is formed as shown in FIG. 15G. Then, when the hard mask 12 is peeled after the film 11 to be processed is subjected to etching with the hard mask 12 as a mask, a desired pattern of the processed film 11 is obtained.

In accordance with this method, the formation of an etching mask which has the size of a self-assembled block copolymer can form a fine line and a narrow space in the middle of the line.

Sixth Embodiment

In the sixth embodiment, described is a method for generating pattern data for a reticle used for implementing a pattern forming method of removing (trimming) the entire block copolymer in a certain region and then removing first block phases in other region as described in the first embodiment. The device pattern is the same as FIG. 1F described in the first embodiment. In addition, the exposure apparatus used is supposed to have a resolution corresponding to the width of a period (including a first block phase 21 and a second block phase 22) of a block copolymer, but fail to resolve the half period.

Figure 16:
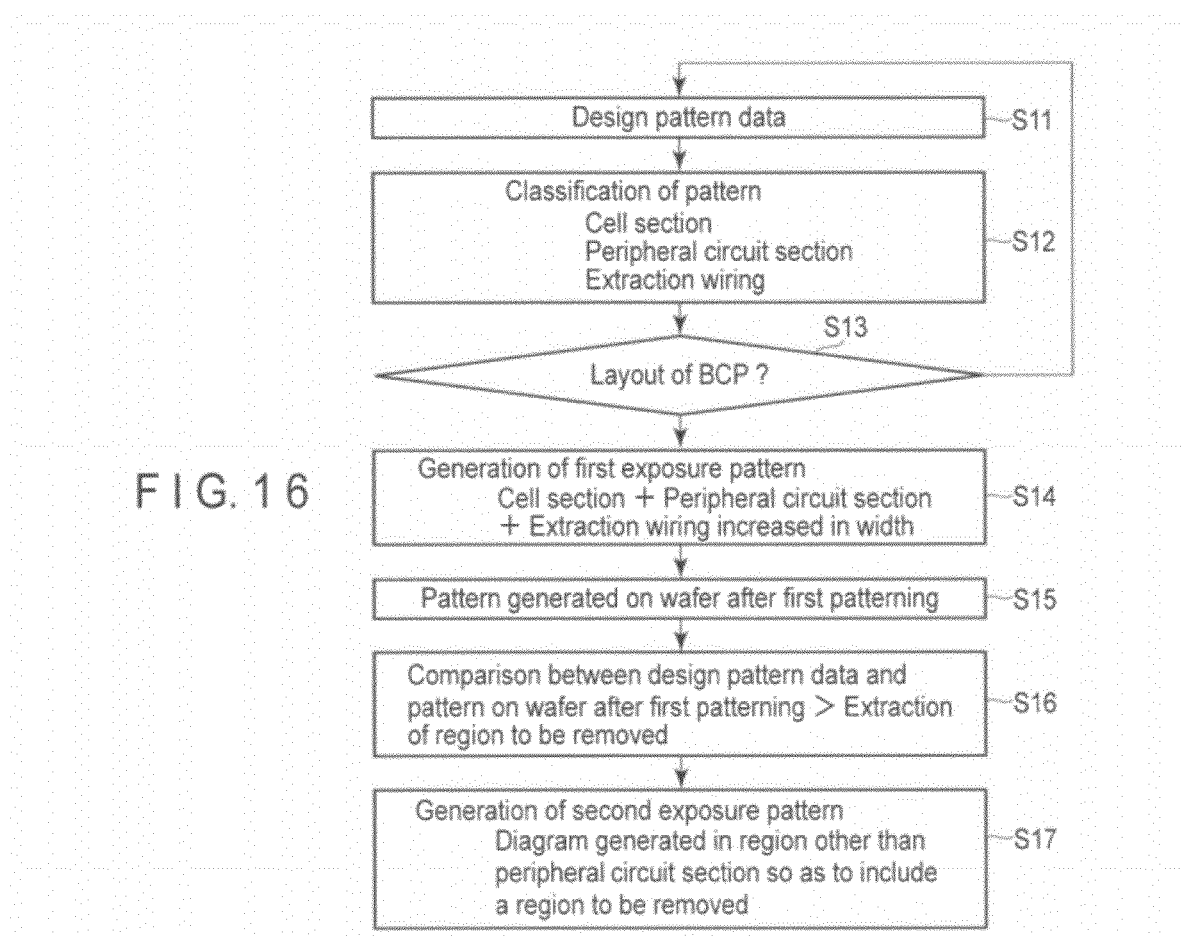
FIG. 16 is a flowchart for the generation of pattern data of a reticle in a sixth embodiment.
Figure 17:
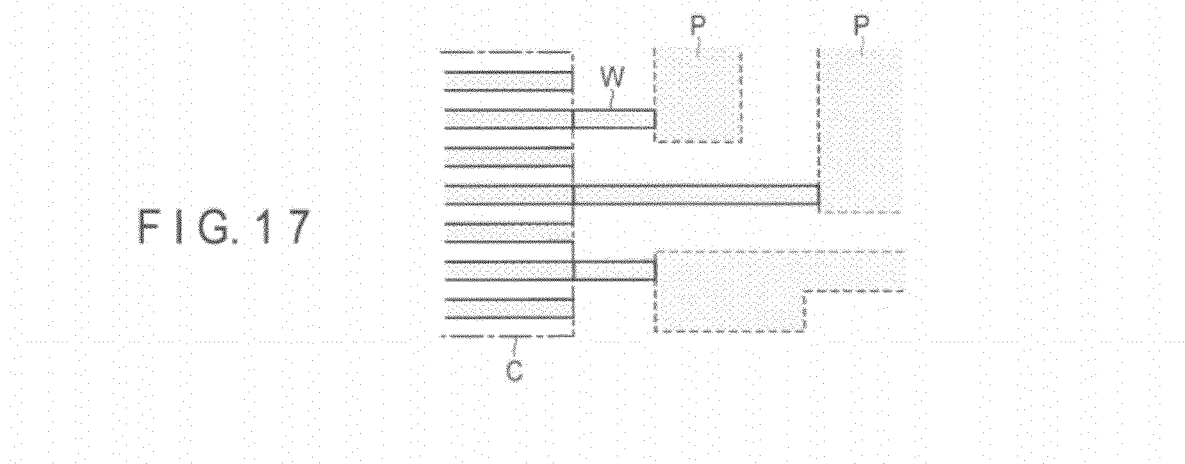
FIG. 17 is a plan view illustrating design pattern data in the sixth embodiment.

FIG. 16 shows a flowchart for the generation of reticle pattern data. First, design pattern data is provided (S11). FIG. 17 shows a plan view of design pattern data. This is a pattern corresponding to FIG. 1F. The design pattern includes patterns corresponding to a cell section (C) with periodic patterns arranged, a peripheral circuit section (P) with a space width and a line width larger than the period of the cell section, and a pattern of extraction wiring (W) connecting both the cell section (C) and the peripheral circuit section (P).

The design pattern data is classified into the cell section, the peripheral circuit section, and the extraction wiring (S12). In FIG. 17, the cell section, the peripheral circuit section, and the extraction wiring are surrounded respectively by alternate long and short dash lines, dashed lines, and solid lines.

In order to obtain a patterned block copolymer, a design is made so that second block phases 22 are formed on the lines in the cell section and the lines of the extraction wiring. The line width of the extraction wiring is almost equal to the half period of the cell section.

The arrangement of a block copolymer (BCP) is laid out so as to match the design pattern data (S13). When there is a discrepancy between both the arrangement and the design pattern data, the design pattern data is modified, and the layout of the block copolymer and the modification of the design pattern data are repeated until the discrepancy is eliminated.

Then, an exposure pattern of reticle (reticle pattern) is generated on the basis of the layout of the block copolymer. It should be noted that while a guide pattern for orienting the block copolymer is also generated separately, no explanation will be given here, because of dependency on the type of the guide pattern.

A first exposure pattern is generated for removing (trimming) the entire block copolymer in a certain region (S14).

First exposure and development leave line pattern sections in the cell section and peripheral circuit section, and data is thus generated so that a region corresponding to these sections serves as a light shielding section. While only the second block phases to serve as lines are left for the extraction wiring, the entire block copolymer is removed in regions adjacent to the lines, which comprise the second block phases. In this case, because the exposure apparatus is not able to resolve the half period of the block copolymer, the data width is increased for the lines left for the extraction wiring. When the block copolymer is supposed to be removed as whole molecules, the width is ideally increased by the ¼ period of the block copolymer on both sides with respect to a final line width. Actually, whether the block copolymer molecules are left or removed depends on the exposure and development characteristics and optical image of the block copolymer, and what is required is thus that unnecessary block copolymer molecules are removed, whereas block copolymer molecules to be left are left. In addition, when the first block phases have main chains cleaved at the same time in the first exposure as in the case of the block copolymer used in the first embodiment, one of the molecules will not be removed. For this reason, the widths of the lines left for the extraction wiring fall within the range of the width increased by the half period on both sides with respect to a final line width.

Figure 18:
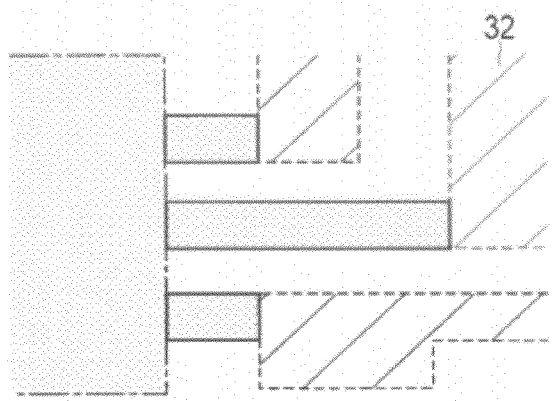
FIG. 18 is a plan view illustrating a reticle pattern generated in the sixth embodiment.

As described above, reticle pattern data is generated so that the cell section, the peripheral circuit section, and the extraction wiring increased in width correspond to a first unexposed region (S14). FIG. 18 shows a plan view of a reticle pattern generated. The cell section, the peripheral circuit section, and the extraction wiring are surrounded respectively by alternate long and short dash lines, dashed lines, and solid lines, and hatching denotes a light shielding section. The reticle pattern shown in FIG. 18 corresponds to the first reticle 110 in FIG. 2A.

On the basis of thus generated reticle pattern data, the position of beam irradiation is determined in an electron beam printing apparatus or a laser beam printing apparatus. Resist applied onto the light shielding film (or the halftone film) on the quartz substrate is subjected to patterning by scanning the resist with beams or moving the quartz substrate with shaping beams. The light shielding film (or the halftone film) is processed with the resist pattern as a mask, thereby preparing the first reticle 110.

Figure 19:
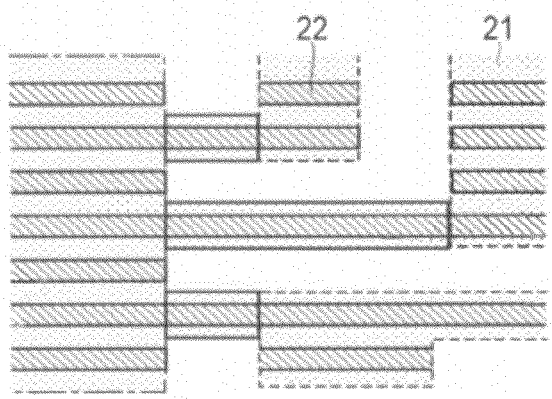
FIG. 19 is a plan view illustrating a block copolymer pattern generated in the sixth embodiment.

Next, pattern data is generated for the block copolymer on the film to be processed, which is formed by the first patterning (S15). FIG. 19 shows a plan view of a block copolymer pattern generated.

The design pattern data in FIG. 17 is compared with the block copolymer pattern in FIG. 19 to extract a region of the first block phases 21 to be removed (S16).

Then, a second exposure pattern is generated (S17). A pattern of not less than the resolution of the exposure apparatus is generated to correspond to the region to be removed, which has been extracted in the previous step. In this case, the second block 22 is not removed by exposure and development, and thus may be included in the exposed region. On the other hand, the line section in the peripheral circuit section, for which the first block phases 21 is to be left, is supposed to be an unexposed region. Reticle pattern data is generated so as to include the extracted region to be removed and satisfy these conditions. Specifically, a pattern is generated in the region other than the line section in the peripheral circuit section so as to include the first block phase region to be removed. This pattern is referred to as a light transmitting section (exposed region).

Figure 20:
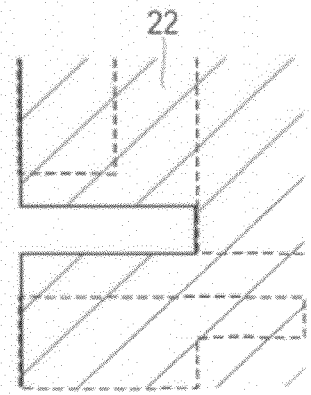
FIG. 20 is a plan view illustrating a reticle pattern generated in the sixth embodiment.

FIG. 20 shows a plan view of a reticle pattern generated. The peripheral circuit section corresponding to the region of the light shielding film is indicated by dashed lines. The reticle pattern in FIG. 20 corresponds to the second reticle 120 in FIG. 2B. The second reticle 120 is created on the basis of the generated reticle pattern data.

The first reticle and second reticle prepared in the way described above are used to form a pattern of block copolymer as in FIG. 1F finally on the film 11 to be processed in accordance with the method described in the first embodiment.

While the light shielding film is used for the unexposed region in the description above, a halftone film may be used.

In the description above, the design pattern data is compared with the pattern data on the block copolymer on the film to be processed after the first patterning to determine the region of first block phases 21 to be removed by the second exposure and development. The first block phases 21 to be removed can also be determined as the cell section and the extended extraction wiring section, and it is thus not always necessary to compare the data. The case with extraction wiring has been described above in the sixth embodiment. However, in the case without extraction wiring, a pattern will be generated for the first unexposed region (light shielding section) so as to correspond to the cell section and the line section in the peripheral circuit section, whereas a pattern including the cell section will be generated in the region other than the line section in the peripheral circuit section for the second exposed region (light transmitting section). In this case, the need for the steps of S15 and S16 is eliminated.

In the description above, a reticle is prepared on the basis of data on the created reticle pattern, and exposure is carried out through the prepared reticle. However, the block copolymer can also be exposed directly to light without using any reticle. More specifically, the position of beam irradiation is determined on the basis of data on the created reticle pattern, and resist on the wafer is exposed to light by scanning the resist with beams or moving the wafer with shaping beams. Laser printing apparatuses, electron beam printing apparatuses, and ion beam printing apparatuses can be used as the exposure apparatus.

In the pattern forming method described in the third embodiment, the light shielding section in the first exposure is merely changed to a light transmitting section, and the method for generating reticle pattern data, which has been described with reference to FIG. 16, can thus be applied directly.

Seventh Embodiment

In the seventh embodiment, described is a method for generating pattern data for a reticle used for implementing a pattern forming method of removing the first block phases 21 in a certain region and then removing an unnecessary region of the left second block phases 22 as described in the second embodiment. The device pattern is the same as FIG. 3D described in the second embodiment, and thus the same as FIG. 1F described in the first embodiment. In addition, the exposure apparatus used is supposed to have a resolution corresponding to the width of a period (including a first block phase and a second block phase) of a block copolymer.

Figure 21:
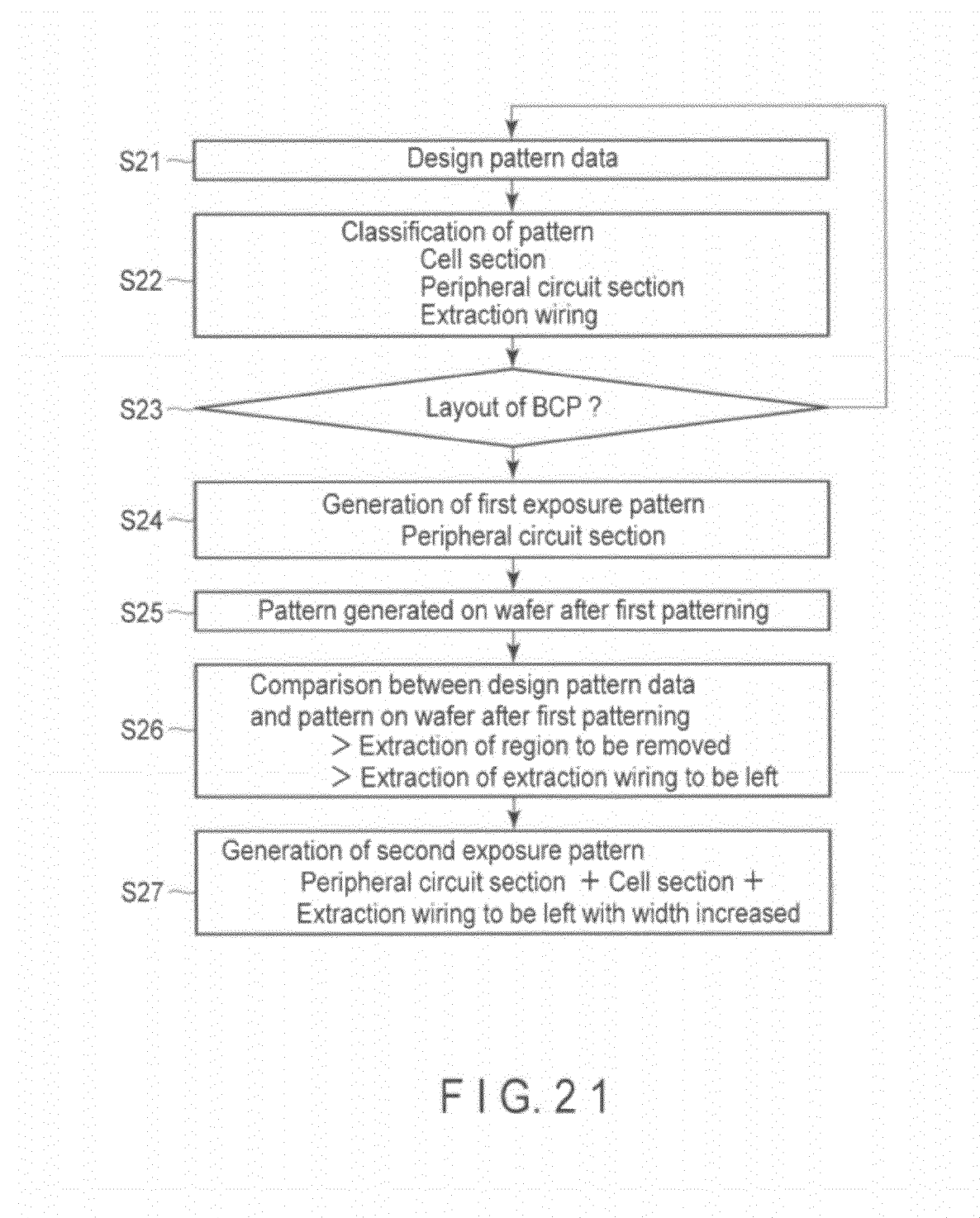
FIG. 21 is a flowchart for the generation of pattern data of a reticle in a seventh embodiment.

FIG. 21 shows a flowchart for the generation of reticle pattern data. As in the case of the sixth embodiment, design pattern data is provided first (S21). The plan view of the design pattern data is the same as FIG. 17, which is a pattern corresponding to FIG. 3D and FIG. 1F. The design pattern data is classified into the cell section, the peripheral circuit section, and the extraction wiring (S22). The arrangement of a block copolymer (BCP) is laid out so as to match the design pattern data (S23). When there is a discrepancy between both the arrangement and the design pattern data, the design pattern data is modified, and the layout of the block copolymer and the modification of the design pattern data are repeated until the discrepancy is eliminated.

A first exposure pattern is generated for removing the first block phases 21 in a certain region (S24). In this case, the second block phases may be exposed to light. Therefore, the first exposure pattern is a reticle pattern in which the line section in the peripheral circuit section serves as a light shielding section. This reticle pattern corresponds to the third reticle 130 in FIG. 4A. On the basis of thus generated reticle pattern data, the third reticle 130 is prepared.

Next, pattern data is generated for the block copolymer on the film to be processed, which is formed by the first patterning (S25). This data corresponds to the pattern of the block copolymer in FIG. 3B.

The design pattern data in FIG. 17 is compared with the block copolymer pattern on the film to be processed after the first patterning to extract a region of the second block phases 22 to be removed and extract the extraction wiring to be left (S26).

Then, a second exposure pattern is generated (S27). While the second block phases 22 to serve as lines are left for the extraction wiring, the lines comprising the second block phases 22 are removed which are adjacent to the left lines. In this case, because the exposure apparatus is not able to resolve the half period of the block copolymer, the width of the light shielding film for forming the extraction wiring is increased to an extent that falls within a range of the half period on both sides with respect to the line width of final extraction wiring. For the second exposure pattern, a pattern is generated which comprises the sell section, the line section in the peripheral circuit section, the extraction wiring increased in width. The generated pattern serves as a light shielding section (an unexposed section). This reticle pattern corresponds to the fourth reticle 140 in FIG. 4B. On the basis of the thus generated reticle pattern data, the fourth reticle 140 is prepared.

The third reticle and fourth reticle prepared in the way described above are used to form a pattern of block copolymer as in FIG. 3D finally on the film 11 to be processed in accordance with the method described in the second embodiment.

While the light shielding film is used for the unexposed region in the description above, a halftone film may be used.

In the description above, the design pattern data is compared with the pattern data on the block copolymer on the film to be processed after the first patterning to determine the region of second block phases 22 to be removed by the second exposure and development. The second block phases 22 to be removed can also be determined as an unnecessary region of the extraction wiring, and it is thus not always necessary to compare the data.

The case with extraction wiring has been described above in the seventh embodiment. However, in the case without extraction wiring, a pattern will be generated for the first unexposed region (light shielding section) so as to correspond to the line section in the peripheral circuit section, whereas a pattern corresponding to the line section in the peripheral circuit section and the cell section will be generated for the second unexposed region (light shielding section). In this case, the need for the steps of S15 and S16 is eliminated.

In the description above, a reticle is prepared on the basis of data on the created reticle pattern, and exposure is carried out through the prepared reticle. However, the block copolymer can also be exposed directly to light without using any reticle. More specifically, the position of beam irradiation is determined on the basis of data on the created reticle pattern, and resist on the wafer is exposed to light by scanning the resist with beams or moving the wafer with shaping beams. Laser printing apparatuses, electron beam printing apparatuses, and ion beam printing apparatuses can be used as the exposure apparatus.

In the pattern forming method described in the fourth embodiment, the light shielding section in the second exposure is merely changed to a light transmitting section, and the method for generating reticle pattern data, which has been described with reference to FIG. 21, can thus be applied directly.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
   a) applying a self-assembling block copolymer including a first block and a second block onto a film to be processed and self-assembling the block copolymer to form a pattern including a first block phase and a second block phase, the block copolymer having a property that the entire block copolymer is removed under a first condition including energy beam irradiation or heating, and development or dry etching, whereas a self-assembled first block phase is selectively removed under a second condition including energy beam irradiation or heating, and development or dry etching;
   b) removing the entire self-assembled block copolymer present in a first region of said pattern formed in a) under the first condition by carrying out energy beam irradiation or heating selectively to the self-assembled block copolymer and carrying out development or dry etching;
   c) selectively removing the first block phase present in a second region of said pattern formed in a) under the second condition by carrying out energy beam irradiation or heating selectively to the self-assembled block copolymer in said second region and carrying out development or dry etching, thereby leaving a new pattern including no self-assembled block copolymer in the first region, self-assembled block copolymer including the first and second block phases in regions of said pattern formed in a) other than the first region and the second region, and the second block phase in the second region; and
   etching the film to be processed with the new pattern as a mask.

2. The method according to claim 1, wherein the first condition is different from the second condition in a wavelength of energy beam, heating temperature, a development condition, or a dry etching condition.

3. The method according to claim 2, wherein the block copolymer contains an acid generator, and acid is generated from the acid generator by energy beam irradiation or heating to change the block copolymer to be soluble in an alkali or insoluble in an organic solvent in the first condition.

4. The method according to claim 2, wherein a main chain of the first block phase is cleaved by energy beam irradiation or heating in the second condition.

5. The method according to claim 2, wherein the development condition of the first condition is different from that of the second condition in a type or concentration of developer.

6. The method according to claim 2, wherein the dry etching condition of the first condition is different from that of the second condition in gas species or plasma energy.

7. The method according to claim 1, wherein a pattern of the second block phase formed in c) forms a periodic pattern which has a period equal to a period of the self-assembled block copolymer, and a pattern of the self-assembled block copolymer including first and second block phases forms a nonperiodic pattern which has a size larger than the period of the self-assembled block copolymer.

8. The method according to claim 7,
   wherein the pattern of the second block phase also includes a nonperiodic pattern which has a width substantially equal to half a period of the self-assembled block copolymer,
   and wherein the periodic pattern of the second block phase and the nonperiodic pattern of the self-assembled block copolymer including the first and second block phases are connected by the nonperiodic pattern of the second block.

9. The method according to claim 1, wherein the pattern of the second block phase formed in c) is connected to the pattern of the self-assembled block copolymer including the first and second block phases and a space is formed by removing the first block phase.

10. The method according to claim 9, wherein a pattern obtained by transferring the periodic pattern of the second block to the film to be processed and a pattern obtained by transferring the nonperiodic pattern of the self-assembled block copolymer including the first and second block phases to the film to be processed are formed so as to be connected to wiring of other level through a contact hole.

11. The method according to claim 10, wherein the contact hole is formed by:
   forming an insulating film on the transferred pattern of the film to be processed;
   applying a block copolymer on the insulating film, and self-assembling the block copolymer so that a cylinder of a first block phase of the block copolymer is oriented perpendicular to a film surface;
   removing only a desired cylinder of the first block phase by carrying out energy beam irradiation or heating selectively to the block copolymer and carrying out development or dry etching; and
   etching the insulating film with the left first and second block phases as masks.

12. The method according to claim 11, wherein the contact hole has a center placed on a grid of a two-dimensional hexagonal lattice.

13. A pattern forming method comprising:
a) applying a self-assembling block copolymer including a first block and a second block onto a film to be processed and self-assembling the block copolymer to form a pattern including a first block phase and a second block phase, the block copolymer having a property that a self-assembled first block phase is selectively removed under a third condition including energy beam irradiation or heating, and development or dry etching, whereas a self-assembled second block phase is selectively removed under a fourth condition including energy beam irradiation or heating, and development or dry etching;
b) selectively removing the first block phase present in a first region of said pattern formed in a) under the third condition by carrying out energy beam irradiation or heating selectively to the self-assembled block copolymer and carrying out development or dry etching; then
c) removing the second block phase from some portion of, but less than all, of the first region under the fourth condition by carrying out energy beam irradiation or heating selectively and carrying out development or dry etching selectively, thereby leaving a new pattern including self-assembled block copolymer including the first block phase and the second block phase in a region of the pattern formed in a) other than the first region, a second block phase in some portion of the first region, and no self-assembled block copolymer in the remaining portion of the first region; and
etching the film to be processed with the left new pattern as a mask.

14. The method according to claim 13, wherein the third condition is different from the forth condition in a wavelength of energy beam, heating temperature, a development condition, or a dry etching condition.

15. The method according to claim 14, wherein the block copolymer contains an acid generator, and acid is generated from the acid generator by energy beam irradiation or heating to change the second block phase to be soluble in an alkali or insoluble in an organic solvent in the forth condition.

16. The method according to claim 14, wherein a main chain of the first block phase is cleaved by energy beam irradiation or heating in the third condition.

17. The method according to claim 14, wherein the development condition of the third condition is different from that of the forth condition in a type or concentration of developer.

18. The method according to claim 14, wherein the dry etching condition of the third condition is different from that of the forth condition in gas species or plasma energy.

19. The method according to claim 13, wherein a pattern of the second block phase formed in b) and c) forms a periodic pattern which has a period equal to a period of the self-assembled block copolymer, and a pattern of the first and second block phases forms a nonperiodic pattern which has a size larger than the period of the self-assembled block copolymer.

20. The method according to claim 19,
wherein the pattern of the second block phase also includes a nonperiodic pattern which has a width substantially equal to half a period of the self-assembled block copolymer,
and wherein the periodic pattern of the second block phase and the nonperiodic pattern including the first and second block phases are connected by the nonperiodic pattern of the second block.

21. The method according to claim 13, wherein the pattern of the second block phase is connected to the pattern of the first and second block phases and a space is formed by removing the first block phase.

22. The method according to claim 21, wherein a pattern obtained by transferring the periodic pattern of the second block to the film to be processed and a pattern obtained by transferring the nonperiodic pattern of the first and second block phases to the film to be processed are formed so as to be connected to wiring of other level through a contact hole.

23. The method according to claim 22, wherein the contact hole is formed by:
forming an insulating film on the transferred pattern of the film to be processed;
applying a block copolymer on the insulating film, and self-assembling the block copolymer so that a cylinder of a first block phase of the block copolymer is oriented perpendicular to a film surface;
removing only a desired cylinder of the first block phase by carrying out energy beam irradiation or heating selectively to the block copolymer and carrying out development or dry etching; and
etching the insulating film with the left first and second block phases as masks.

24. The method according to claim 23, wherein the contact hole has a center placed on a grid of a two-dimensional hexagonal lattice.

* * * * *